US008196732B2

(12) United States Patent
Fatula, Jr. et al.

(10) Patent No.: US 8,196,732 B2
(45) Date of Patent: Jun. 12, 2012

(54) BUFFERED STORAGE AND TRANSPORT DEVICE FOR TOOL UTILIZATION

(75) Inventors: Joseph John Fatula, Jr., San Jose, CA (US); Roumen Iliev Deyanov, Freemont, CA (US); Kevin Tzou, San Jose, CA (US); Pablo Gonzalez, Oakland, CA (US); Robert Carlson, Milpitas, CA (US); John Brooks Greene, Pleasanton, CA (US)

(73) Assignee: Muratec Automation Co., Ltd., Kyoto (JP)

( * ) Notice: Subject to any disclaimer, the term of this patent is extended or adjusted under 35 U.S.C. 154(b) by 187 days.

(21) Appl. No.: 12/848,442

(22) Filed: Aug. 2, 2010

(65) Prior Publication Data

US 2011/0031091 A1    Feb. 10, 2011

Related U.S. Application Data

(60) Provisional application No. 61/273,139, filed on Jul. 31, 2009.

(51) Int. Cl.
*B65G 49/06* (2006.01)
*B66B 17/04* (2006.01)
*H01L 21/677* (2006.01)

(52) U.S. Cl. ............. 198/346.3; 198/346.2; 414/222.07; 414/281

(58) Field of Classification Search ............... 198/346.1, 198/346.2, 346.3, 466.1; 414/222.01, 222.06, 414/222.07, 225.01, 281, 940
See application file for complete search history.

(56) References Cited

U.S. PATENT DOCUMENTS

| 853,484 | A | | 5/1907 | Taylor |
|---|---|---|---|---|
| 2,598,750 | A | | 6/1952 | Bargehr |
| 3,630,390 | A | | 12/1971 | Tax et al. |
| 3,656,631 | A | | 4/1972 | Rauch et al. |
| 3,881,608 | A | | 5/1975 | Hupkes |
| 3,945,503 | A | | 3/1976 | Cooper |
| 4,986,714 | A | | 1/1991 | Fernstrom |
| 5,049,022 | A | | 9/1991 | Wilson |
| 5,570,990 | A | * | 11/1996 | Bonora et al. ............... 414/543 |
| 5,980,183 | A | * | 11/1999 | Fosnight ................. 414/222.01 |
| 6,079,927 | A | * | 6/2000 | Muka ......................... 414/217 |
| 6,129,496 | A | * | 10/2000 | Iwasaki et al. ........... 414/222.01 |

(Continued)

FOREIGN PATENT DOCUMENTS

JP    2004-189361    7/2004

(Continued)

OTHER PUBLICATIONS

PCT Notification of Transmittal of the International Search Report and the Written Opinion of the International Searching Authority from counterpart International application No. PCT/US2010/044072, dated Apr. 21, 2011.

(Continued)

*Primary Examiner* — Douglas Hess
(74) *Attorney, Agent, or Firm* — Fish & Richardson P.C.

(57) ABSTRACT

A transport mechanism is configured to transport a work piece carrier within a buffer in fabrication facility, comprising: a transporter configured to travel on two rails, wherein the transporter comprises (i) a flat belt hoist mechanism configured to lift and to lower one or more work piece carriers, and (ii) a gripper mechanism configured to capture and to release the one or more work piece carriers.

8 Claims, 48 Drawing Sheets

U.S. PATENT DOCUMENTS

| | | | | |
|---|---|---|---|---|
| 6,283,692 | B1 * | 9/2001 | Perlov et al. | 414/222.01 |
| 6,336,546 | B1 * | 1/2002 | Lorenz | 198/346.2 |
| 6,468,021 | B1 * | 10/2002 | Bonora et al. | 414/522 |
| 6,575,687 | B2 | 6/2003 | Bonora et al. | |
| 6,663,340 | B1 * | 12/2003 | Zeakes et al. | 414/788 |
| 6,677,690 | B2 * | 1/2004 | Fosnight et al. | 307/326 |
| 6,739,820 | B2 * | 5/2004 | Chang et al. | 414/217.1 |
| 6,877,944 | B2 * | 4/2005 | Peiter | 414/279 |
| 6,889,813 | B1 * | 5/2005 | Trammell et al. | 198/346.3 |
| 6,955,517 | B2 * | 10/2005 | Nulman et al. | 414/222.01 |
| 6,990,721 | B2 * | 1/2006 | Mariano et al. | 29/469 |
| 6,996,448 | B2 * | 2/2006 | Huang et al. | 700/112 |
| 7,165,927 | B2 * | 1/2007 | Doherty et al. | 414/331.02 |
| 7,261,510 | B2 * | 8/2007 | Motoori et al. | 414/281 |
| 7,274,971 | B2 * | 9/2007 | Brill et al. | 700/230 |
| 7,359,767 | B2 * | 4/2008 | Rice et al. | 700/245 |
| 7,413,069 | B2 * | 8/2008 | Brill et al. | 198/358 |
| 7,506,746 | B2 * | 3/2009 | Rice et al. | 198/465.1 |
| 7,661,919 | B2 * | 2/2010 | Bonora et al. | 414/222.01 |
| 7,695,234 | B2 * | 4/2010 | Yamashita | 414/277 |
| 7,711,445 | B2 * | 5/2010 | Rice et al. | 700/101 |
| 7,806,643 | B2 * | 10/2010 | Friedman et al. | 414/222.01 |
| 7,972,104 | B2 * | 7/2011 | Shiwaku et al. | 414/282 |
| 8,024,065 | B2 * | 9/2011 | Brill et al. | 700/230 |
| 8,070,410 | B2 * | 12/2011 | Rebstock | 414/281 |

FOREIGN PATENT DOCUMENTS

| | | |
|---|---|---|
| JP | 2006-41208 | 2/2006 |
| JP | 2008-222346 | 9/2008 |
| JP | 2009-62155 | 3/2009 |

OTHER PUBLICATIONS

PCT International Preliminary Report on Patentability from International Application No. PCT/US2010/044072, dated Feb. 9, 2012.

* cited by examiner

BUFFERED STORAGE AND TRANSPORT DEVICE FOR TOOL UTILIZATION

CLAIM OF PRIORITY

This application claims priority under 35 U.S.C. §119(e) to provisional U.S. Patent Application 61/273,139, filed on Jul. 31, 2009, the entire contents of which are hereby incorporated by reference.

TECHNICAL FIELD

This patent application relates generally to buffered storage and delivery of work piece containers in an overhead transport system ("OHT").

BACKGROUND

A transport device (e.g., a robotic arm) is configured to travel on rails in a vertical direction to access shelves and load ports in an OHT. The transport device may include a crane to lift and place containers into and out of the shelves and load ports.

SUMMARY

A transport mechanism is configured to transport a work piece carrier within a buffer in fabrication facility, comprising: a transporter configured to travel on two rails, wherein the transporter comprises (i) a flat belt hoist mechanism configured to lift and to lower one or more work piece carriers, and (ii) a gripper mechanism configured to capture and to release the one or more work piece carriers; a work piece container configured to store one or more work pieces; an enclosed frame comprising one or more storage shelves configured to hold the one or more work piece containers; an enclosed frame having one or more input/output shelves for work piece container exchange with an overhead transport vehicle; an enclosed frame with rails mounted above each shelf and at the base above a load port on which the transporter travels; an enclosed frame having an elevator configured to move the transporter between levels; a frame elevator having a carriage with two rails to support the transporter with work piece container during movement between levels; a frame elevator having alignment capability for aligning the carriage rails with the frame mounted rails above each shelf and at the base of the frame above a load port; a frame support configured to elevate the frame above one or more load ports of a process tool; a control mechanism configured to: direct the transporter to move from shelf to/from load port locations, transporting work piece containers; direct the elevator to move from level to level moving the transporter; synchronize movement of the elevator, transporter, and work piece containers, exchange commands with a work piece container movement system that manages the movement of work piece containers within a fabrication facility.

Any two or more of the features described in this patent application, including this summary section, may be combined to form embodiments not specifically described in this patent application.

The details of one or more examples are set forth in the accompanying drawings and the description below. Further features, aspects, and advantages will become apparent from the description, the drawings, and the claims.

DETAILED DESCRIPTION

Figure 1:
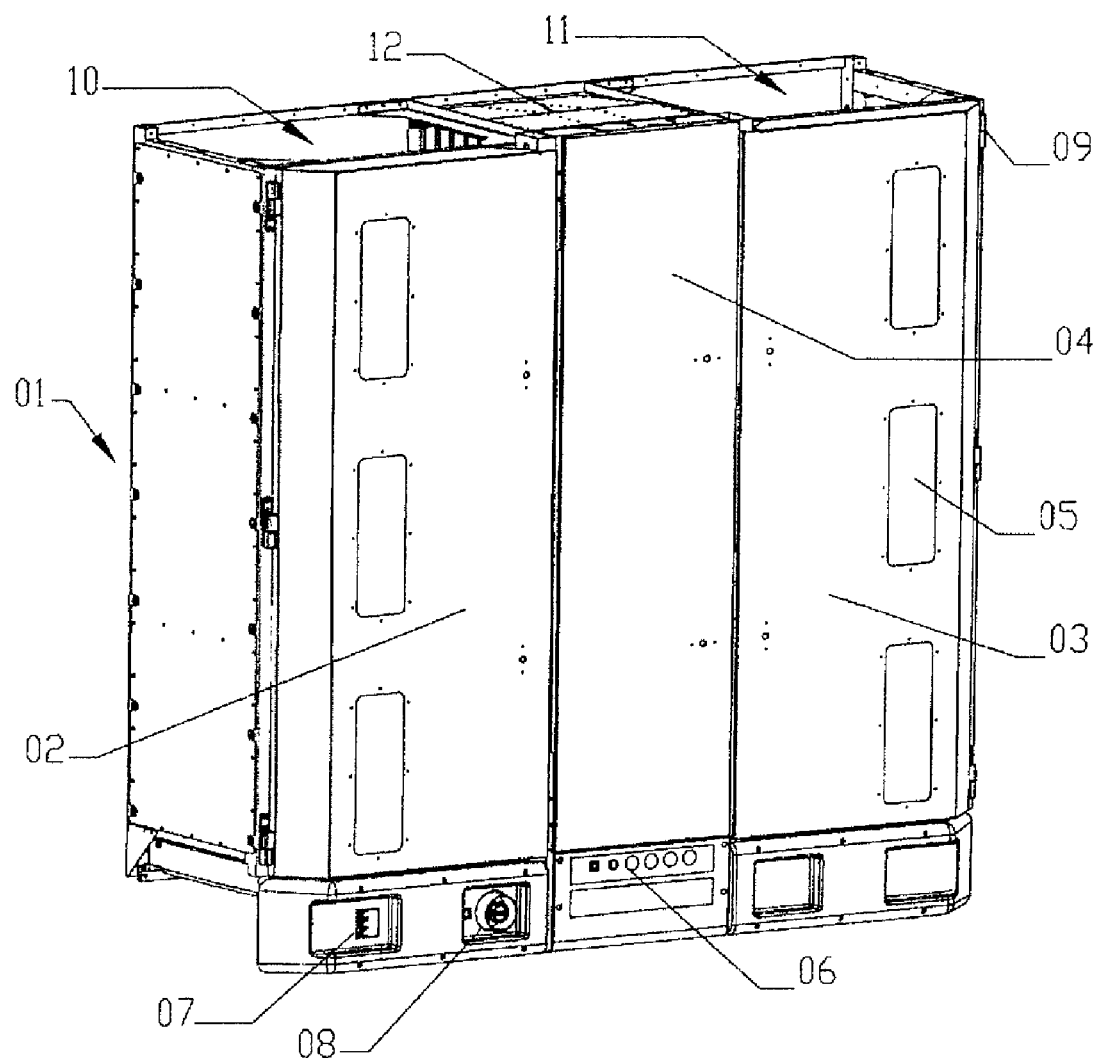
FIG. 1 is a perspective view of a buffer.

Referring to FIG. 1, a front view of buffer 01 for use in an OHT system is shown. Buffer 01 may include a device used for storage of work piece containers. In the illustrative example of FIG. 1, buffer 01 includes storage space for six work piece containers. Buffer 01 is designed to fit within an OHT delivery chimney, including, e.g., a space above a load port of a process tool through which an OHT vehicle is configured to drop off and/or pick up a work piece container. Buffer 01 includes access door 02 and access door 03. Access doors 02, 03 include windows 05 and hinges 09. Access doors 02, 03 are used to open buffer 01 to allow removal of work piece containers (e.g., manual removal of work piece containers). Buffer 01 also includes maintenance door 04, which encloses an electronics and mechanism area. A state of buffer 01 is displayed on lights panel 06. Buffer 01 includes emergency off interlock 08, which is configured to shut down robotics included in buffer 01 and to shut down electrical power via power circuit breaker 07. Buffer 01 may be enclosed, for example by a protective covering, to provide for human safety and to provide for seismic protection of the work piece containers.

Buffer 01 also includes bidirectional ports 10, 11, which are configured to connect buffer 01 to the OHT system. Bidirectional ports 10, 11 are configured to be used as storage shelves. Bidirectional ports 10, 11 are configured to act as input ports for deposit work piece containers in the OHT system. Bidirectional ports 10, 11 are also configured to act as output ports from which work piece containers may be retrieved by robotic mechanisms (e.g., a robotic arm) in the OHT system.

In the illustrative example of FIG. 1, buffer 01 includes two columns of shelves. In another example, buffer 01 may include various numbers of columns of shelves, including, e.g., one column, two columns, three columns, fourth columns, and so forth.

Figure 2:
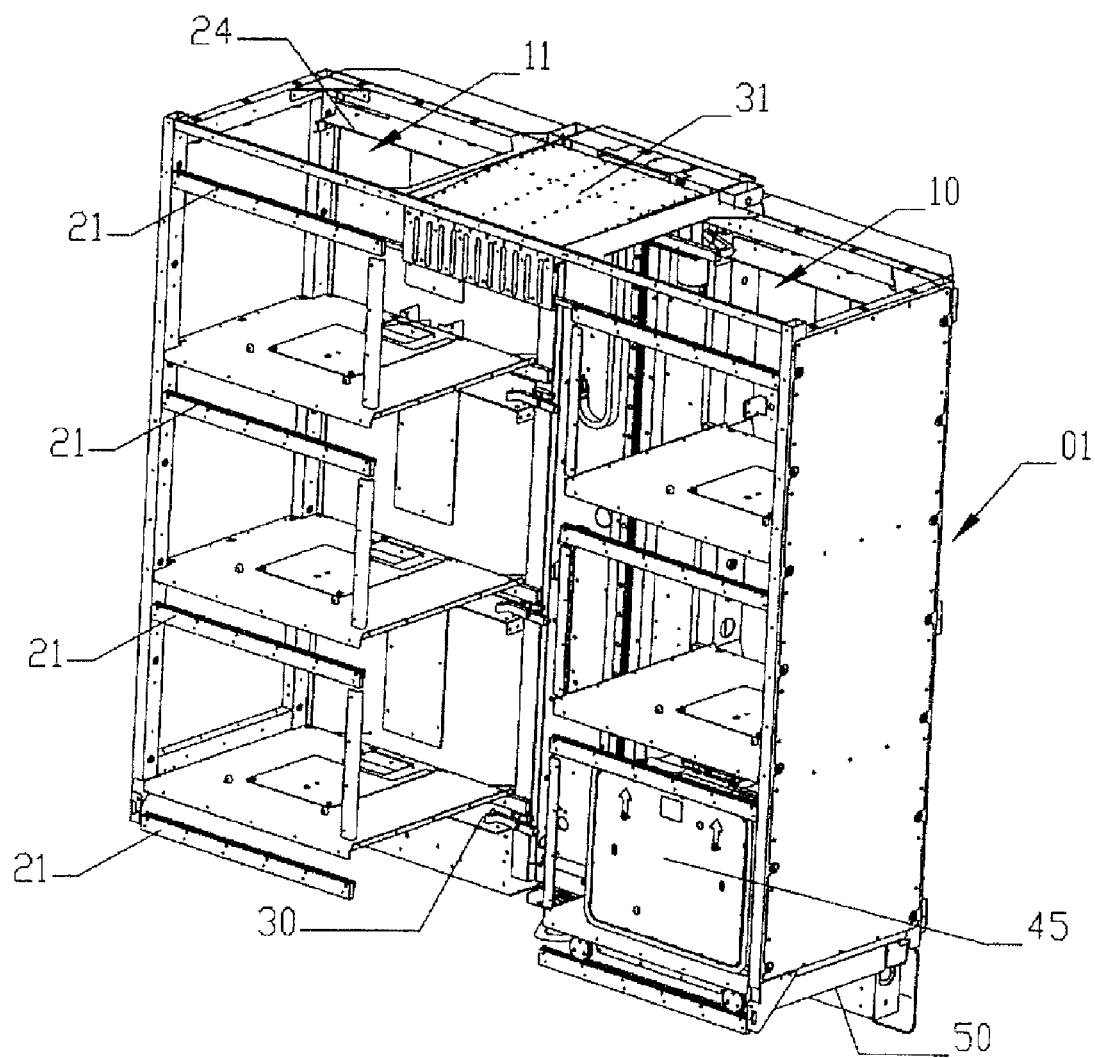
FIG. 2 is a perspective view of the buffer from the rear with the back panel removed showing the elevator in an upper position.

Referring to FIG. 2, a perspective view of buffer 01 with a rear panel removed is illustrated. An elevator mechanism (not shown) includes elevator carriage 31, which is configured to move transporter 50 between various shelves included in buffer 01. Buffer 01 includes four level levels. The middle two levels are for work piece container storage. The top level is for work piece container storage and/or for input of work piece containers from the OHT system or output of containers to the OHT. The bottom level is for transport of the work piece containers to and from the load ports of the process tool.

Carriage 31 is configured to move transporter 50 between the various levels. Carriage 31 is configured to travel on a guide mechanism and is configured to be driven in vertical motion via a motion mechanism, as described herein.

Carriage 31 aligns with transporter guide rails 21 and transporter support rails 24 (collectively referred to herein as "rails 21, 24", without limitation, for purposes of convenience) on each level. Through alignment of carriage 31 with rails 21, 24, transporter 50 may move from rails 21, 24 onto carriage 31, which may then move transporter 50 to another location in OHT system. Work piece container 45 may be stored in a storage location, an input/output location, a load port location, and so forth. In the illustrative example of FIG. 2, transporter 50 may be configured to move between internal positions and external load port positions.

Integrated safety device 30 is configured to prevent transporter 50 from traveling off rails 21, 24 and into an elevator chimney, for example when carriage 31 is not properly aligned with a level in which transporter 50 is located. An OHT vehicle (not shown) is configured to lower a work piece container to either of top shelves 10, 11. Transporter 50 is configured to travel in a horizontal direction (e.g., a left-right direction, a "X" direction, and so forth) along rails 21, 24.

Figure 3:
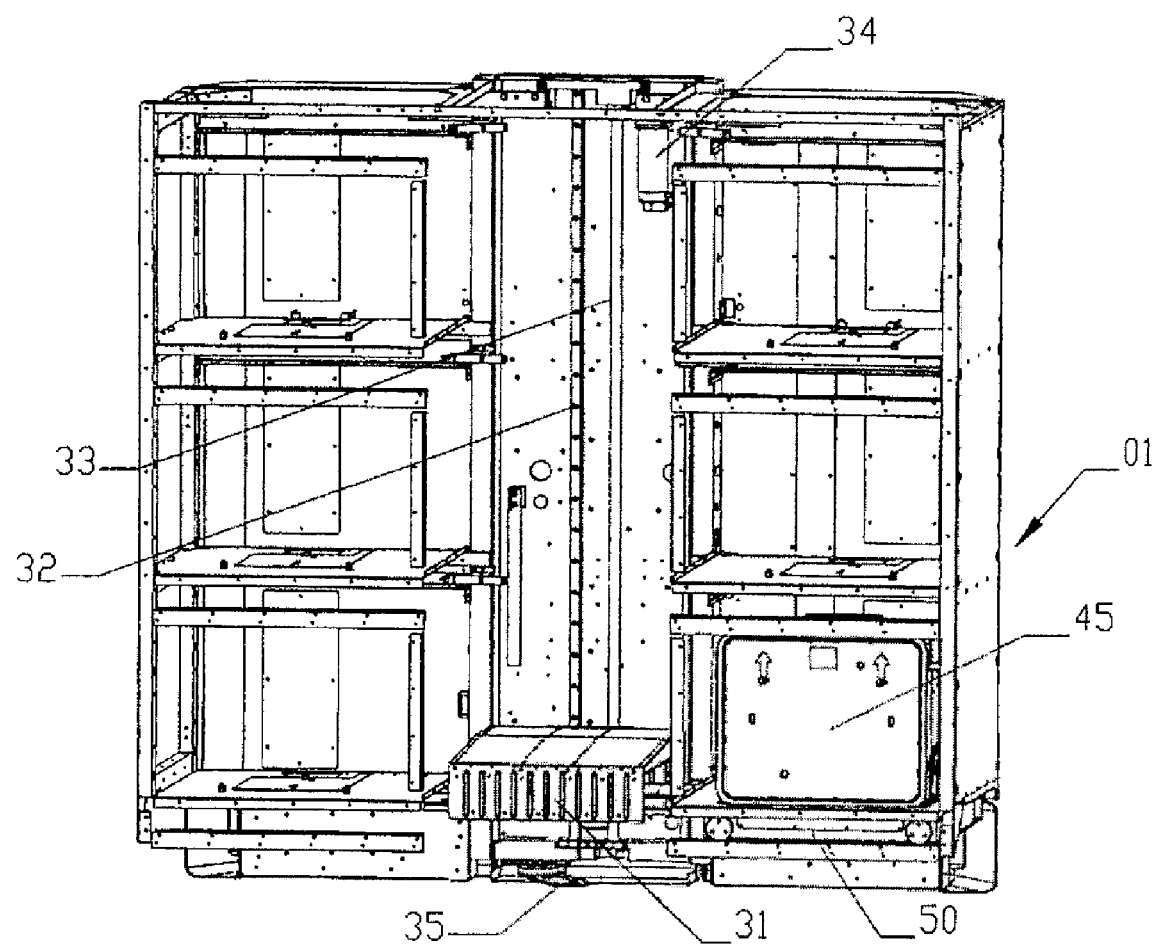
FIG. 3 is a perspective view of the buffer from the rear with the back panel removed showing the elevator in a lower position.

FIG. 3 illustrates a front view of buffer 01 with the rear panel removed. In the illustrative example of FIG. 3, elevator carriage 31 is located at an intermediate position, which is misaligned with transporter 50. Due to the misalignment of elevator carriage 31 with transporter 50, transporter 50 may not move from rails under the shelf, which holds transporter 50, to elevator carriage 31. Shutter 35 includes a safety device to prevent a work piece container from falling through an elevator column and out of a bottom of buffer 01. When shutter 35 is in a closed position, maintenance and other human work may proceed on tool and load ports below buffer 01 without a safety risk.

Elevator mechanism (not shown) includes linear bearing guide 32 and elevator ball screw 33, which are both configured to move elevator carriage 31 between levels of buffer 02. Elevator motor 34 includes a drive motor. Elevator motor 34 is located at a top of the elevator column and is configured to rotate elevator ball screw 33. Rotation of elevator ball screw 33 causes elevator carriage 31 to move between levels in buffer 01. As elevator carriage 31 moves between levels in buffer 01, elevator carriage 31 traverses a path (e.g., referred to as an elevator channel path) along linear bearing guide 32 in a vertical direction (e.g., an up and down direction, a direction along a "Z" axis, and so forth). Elevator carriage 31 may also be caused to move along an elevator channel path by a rotation of various other motion mechanisms, including, e.g., a belt driver, a lead screw, a linear motor, a rack and a pinion, a cable, a chain, a so forth. Elevator carriage 31 may be guided by various guide mechanisms, including, e.g., a double "V" bearing/block guide, a linear rod guide, a bearingless bushing guide, rolling wheel guide, and so forth.

Elevator carriage 31 may be moved in a vertical direction to align with the rails 21, 24. When elevator carriage 31 is aligned with rails 21, 24, transporter 50 may move in a horizontal direction onto elevator carriage 31. Elevator carriage 31 is moved in a Z direction to a shelf and elevator carriage 31 delivers transporter 50 to the shelf. Transporter 50 picks up and/or deposits work piece container 45 to the shelf and travels back to elevator carriage 31

Figure 4:
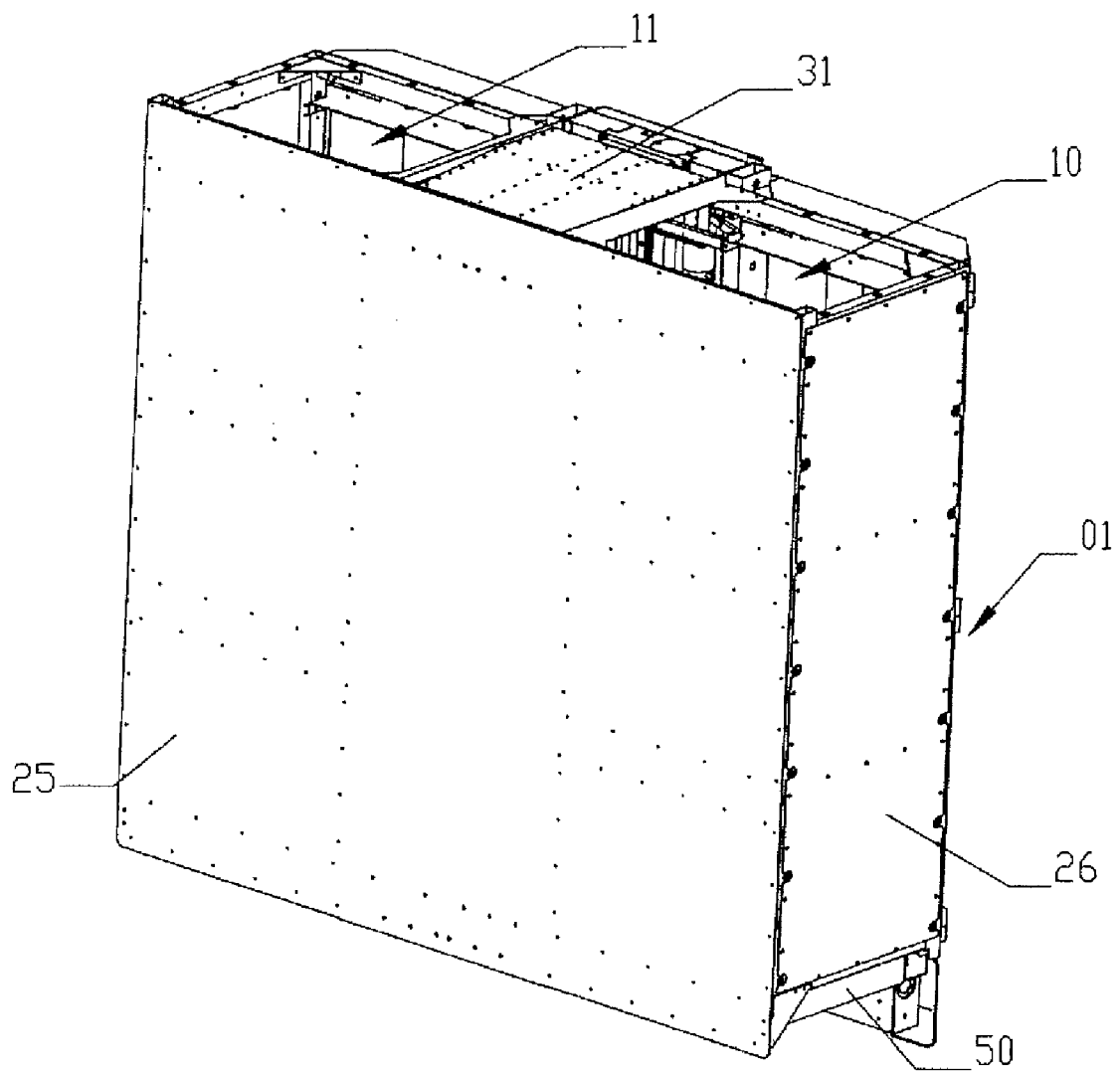
FIG. 4 is a perspective view of the buffer from the rear with the back panel attached.

FIG. 4 illustrates a rear view of buffer 01 with rear panel 25 and side panels 26 in place. In the illustrative example of FIG. 4, transporter 50 is located in a left load port drop-off/pick-up position. Carriage 31 is located in an upper most position.

Figure 5:
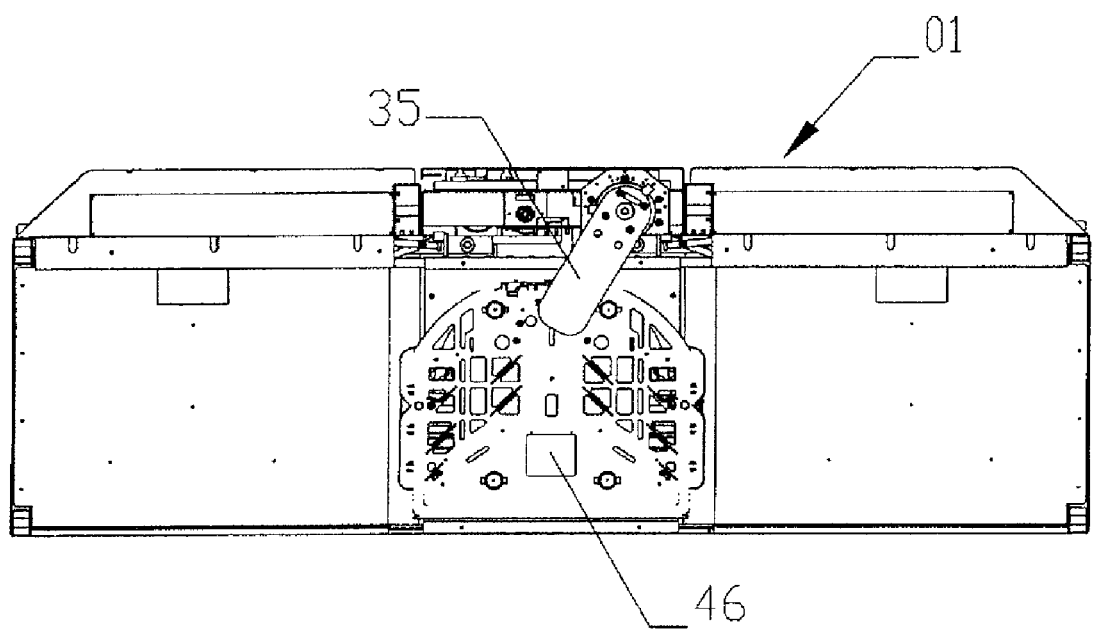
FIG. 5 is a perspective view of the buffer from the bottom with the shutter closed.

FIG. 5 illustrates a bottom view of a buffer 01 with shutter mechanism 35 in a closed position. When shutter mechanism 35 is in a closed position, shutter mechanism 35 blocks work piece container 46 and transporter 50 from being able to exit buffer 01. In the illustrative example of FIG. 5, transporter 50 is located above work piece container 46 in an elevator channel. In an example, work piece container 46 becomes disconnected from transporter 50 (e.g., from a top flange failure on work piece container 46), shutter mechanism 35 is configured to block a falling work piece container from being able to exit buffer 01.

Figure 6:
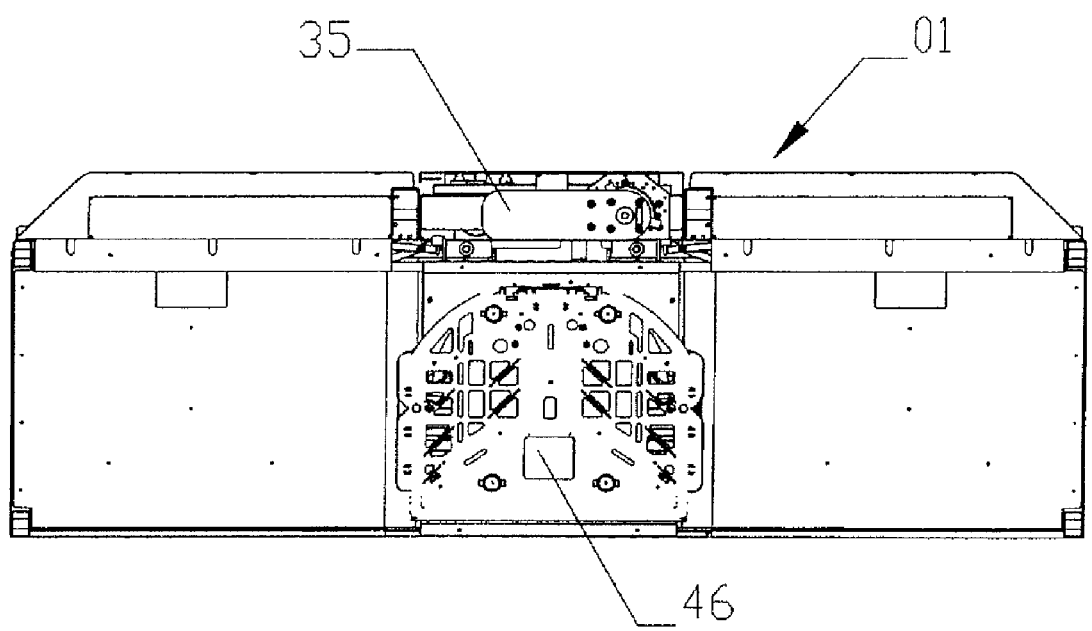
FIG. 6 is a perspective view of the buffer from the bottom with the shutter opened.

FIG. 6 illustrates a bottom view of buffer 01 with shutter mechanism 35 in an open position. When shutter mechanism 35 is in an open position, shutter mechanism 35 is configured to permit work piece container 46 and transporter 50 to exit and/or to enter buffer 01.

Figure 7:
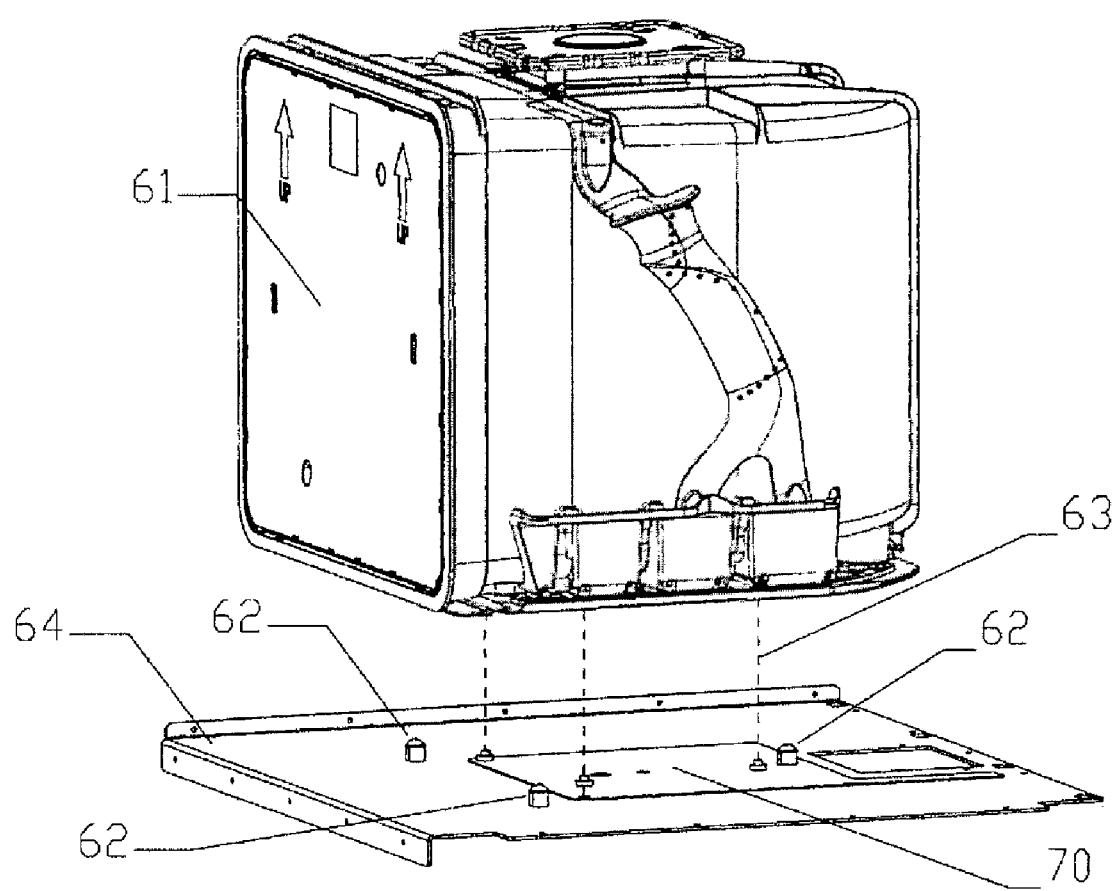
FIG. 7 is a perspective view of a placement and presence sensor mechanism.

Referring to FIG. 7, sensor array 70 (e.g., a placement and presence sensor array) is mounted on shelf 64. Sensor array 70 is configured to detect the presence of work piece container 61. Sensor array 70 is also configured to detect a placement of work piece container 61 on kinematic pins 62. A kinematic socket (not shown) in work piece container 61 aligns with kinematic pins 62 along axis 63, for example, during placement of work piece container 60 onto kinematic pins 62. Sensor array 70 may include a detector to detect a presence of work piece container 61. For example, activation of the detector may occur when work piece container 61 is properly placed on kinematic pins 62.

The dimensions of sensor array 70 may include a height of 1-3 millimeters ("mm"). Sensor array 70 may also integrate multiple sensors into a single array. Sensor array 70 may also include an adhesive backing for attachment to shelf 64. Through use of the adhesive backing, sensor array 70 is mounted to shelf 64 at a low mounting height. The low mounting height permits a large density of work piece containers to be stored in a vertical space, including, e.g., a tall buffer including many levels of shelves.

Figure 8:
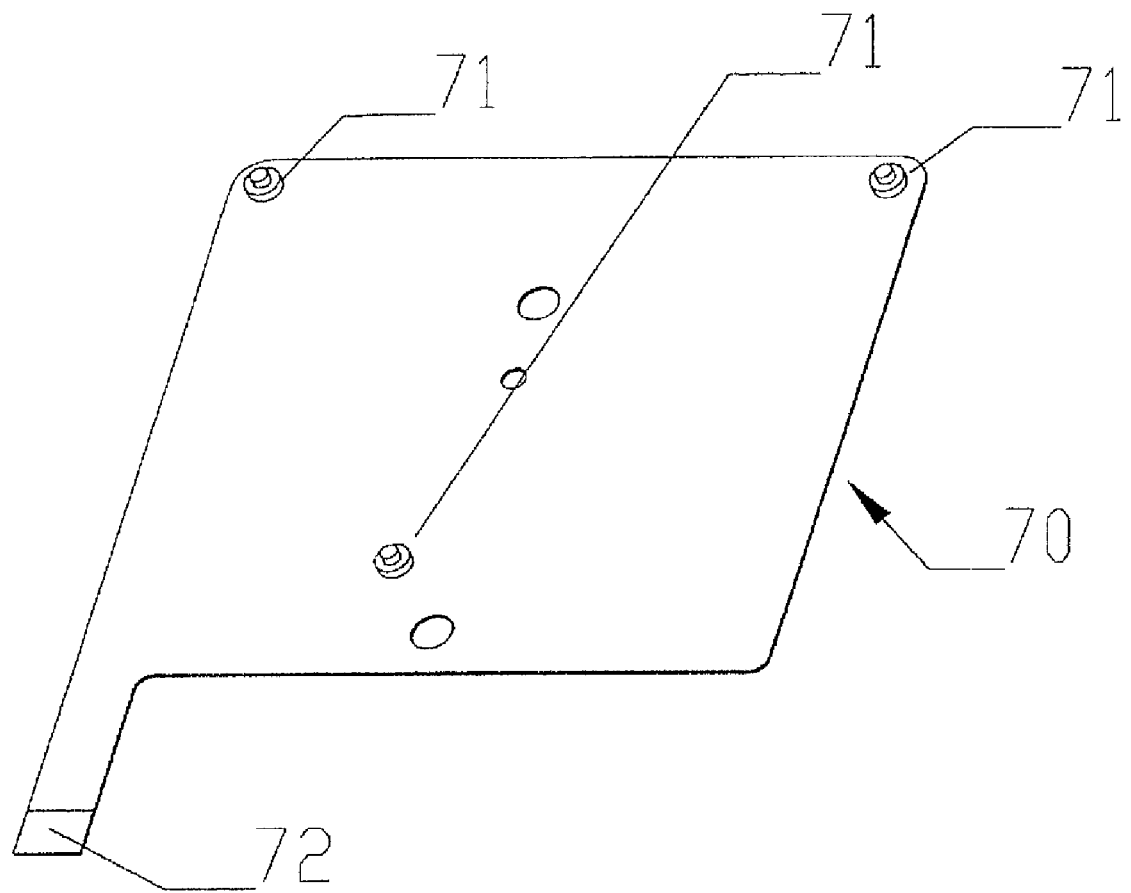
FIG. 8 is a perspective view of a placement and presence sensor array.
Figure 9:
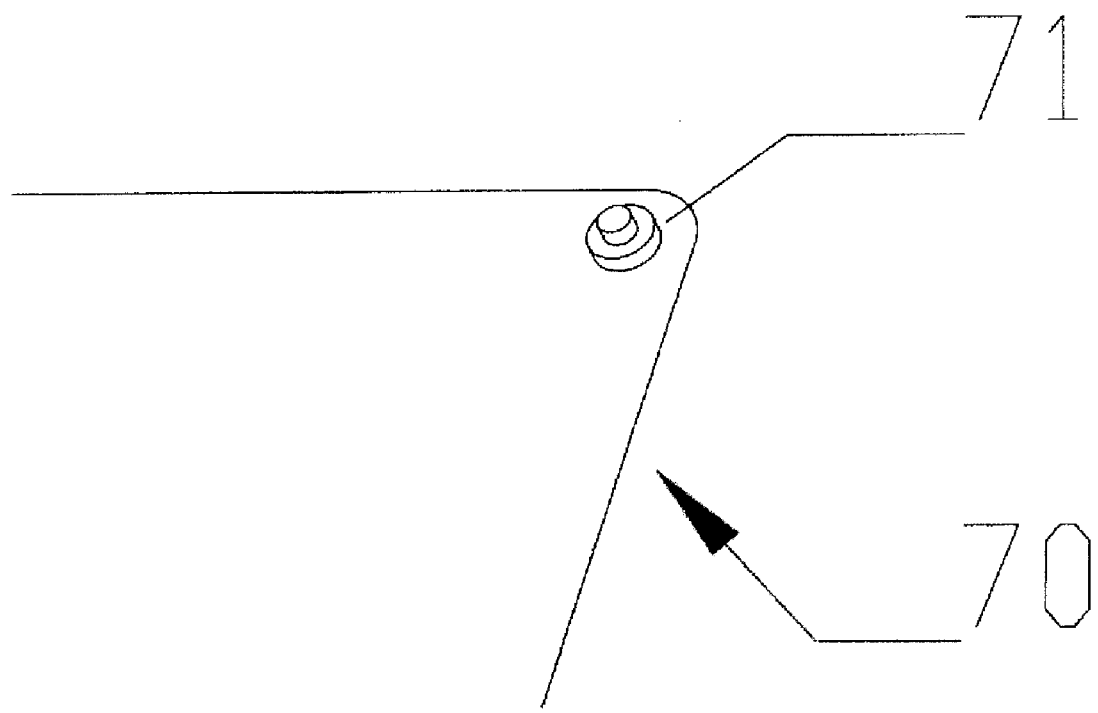
FIG. 9 is a perspective view of the contact pad of the placement and presence sensor.

Referring to FIGS. 8 and 9, sensor array 70 includes pressure pads 71. Pressure pads 71 may provide sensor array 70 with force activation characteristics. Pressure pads 71 may include a force activation material, including, e.g., a rigid material, an elastomeric material, a multi-stage elastomeric material, to provide an appropriate distribution of force as work piece container 61 makes physical contact with pressure pads 71 to activate a switch (not shown) in sensor array 70. Sensor array 70 also includes electrical connection 72 that is configured to make contact with switches (not shown) in sensor array 70.

Pressure pads 71 provide sufficient force transfer from work piece container 61 to the switch in sensor array 70 to activate the switch. Pressure pads 71 also provide force and energy absorption from work piece container 61 as work piece container 61 is placed on kinematic pins 62 to minimize vibration being induced into work pieces in work piece container 61.

Figure 10:
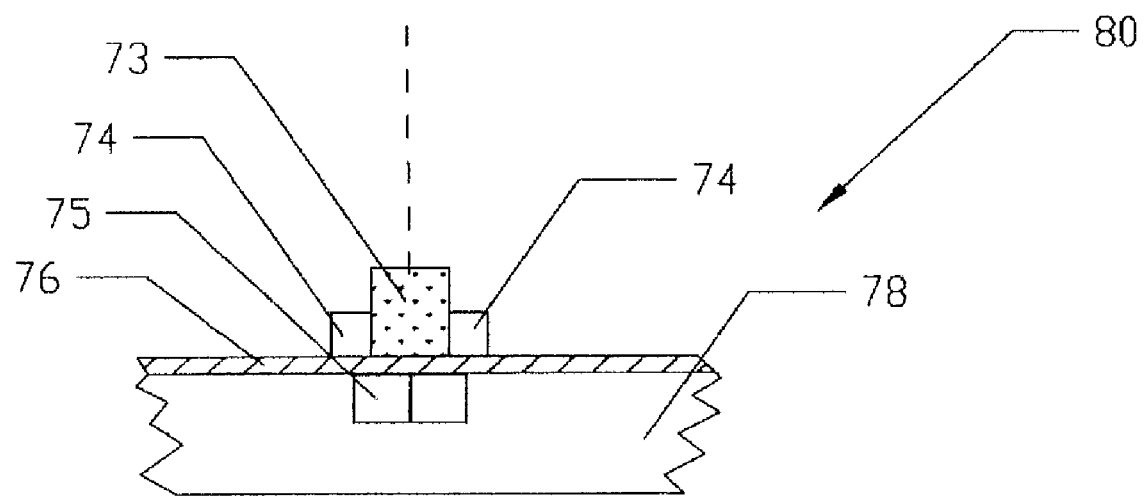
FIG. 10 is a cross section view through a contact pad of the placement and presence sensor.

Referring to FIG. 10, sensor array element 80 includes mechanical membrane switch 75, flexible top membrane 76, membrane assembly body 78, and force transfer mechanisms 73, 74. In the illustrative example of FIG. 10, work piece container 61 approaches sensory array element 80, for example, by work piece container 61 being moved on transporter 50. A pressure from work piece container 61 contacts force transfer mechanism 73 and compresses force transfer mechanism 73. At some point during compression, membrane switch 75 is activated and provides an electrical signal to buffer 01 of a presence and/or a placement of work piece container 61. As a load of work piece container 61 is transferred from transporter 50 to a shelf in buffer 01, force transfer mechanism 73 compresses to a point where work piece container 61 contacts force transfer mechanism 74. An energy of motion of work piece container 61 is absorbed by a combination of force transfer mechanisms 73, 74, which at this point are of approximately equal heights and may further be compressed up to a point where work piece container 61 rests on kinematic pins 62.

Figure 11:
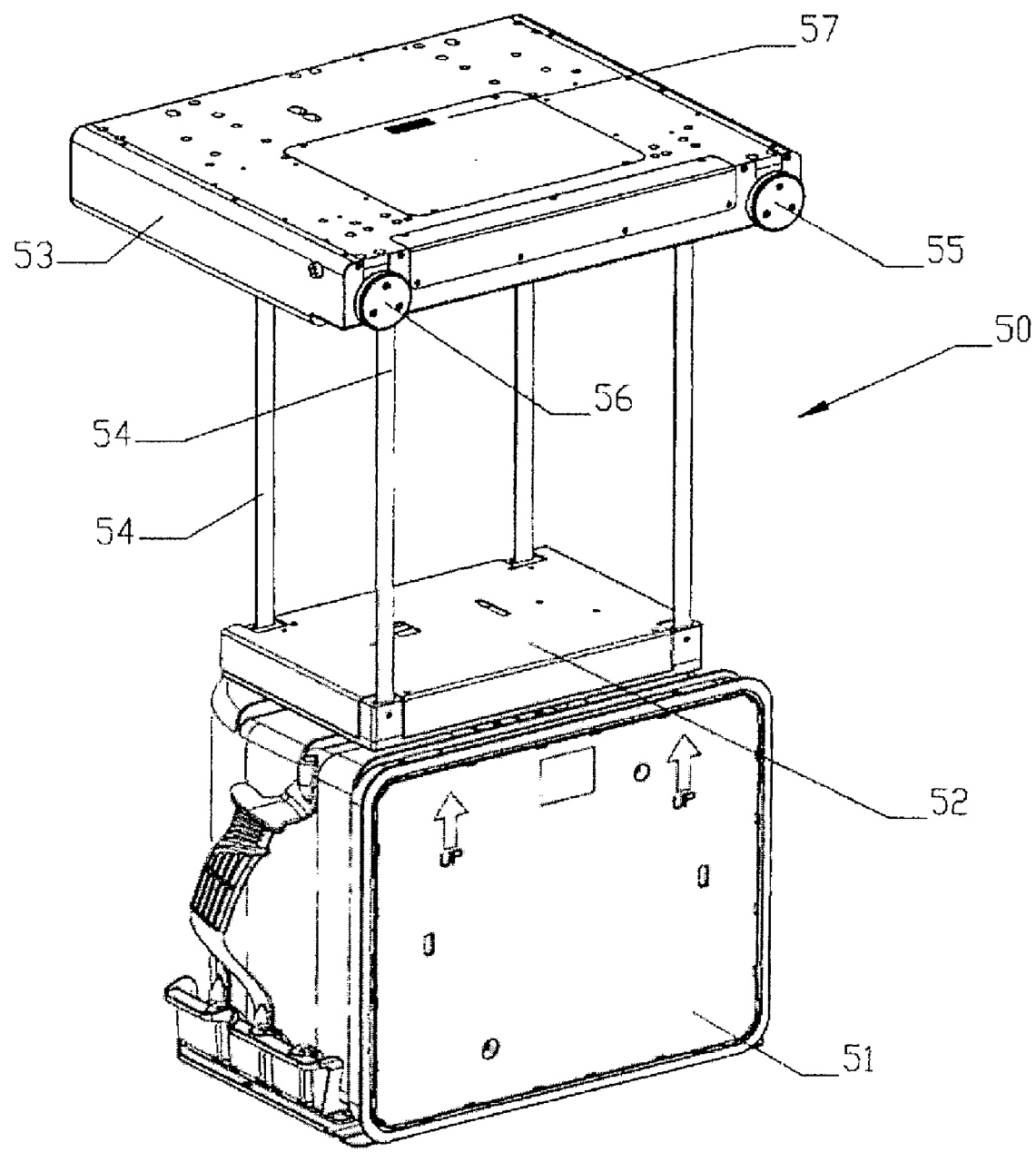
FIG. 11 is a perspective view of a transport device with a gripper extended to carry a work piece container.

Referring to FIG. 11, transporter 50 includes gripper 52. In the illustrative example of FIG. 11, gripper 52 is in an extended position and is holding work piece container 51. Transporter 50 includes transporter body 53 and gripper 52. Transporter 50 includes device wheel 56 that is configured to drive transporter 50 in a horizontal direction (e.g., along an X-axis direction). Encoder wheel 55 is configured to provide transporter 50 with feedback information indicative of a location of transporter 50. Encoder wheel 55 includes a mechanical brake (not shown) that is configured to hold a position in which motion of transporter has stopped (e.g., to eliminate a need to keep a motor driver powered on during stationary time frames). Transporter body 53 also includes an idler wheel (not shown).

Gripper 52 is configured to be raised and to be lowered from transporter 50 via hoist belts 54. When in a retracted position, gripper 52 is housed by transporter body 53. Gripper 52 may be extended various lengths, for example, to reach a shelf, an input/output shelf, or a load port in buffer 01.

Figure 12:
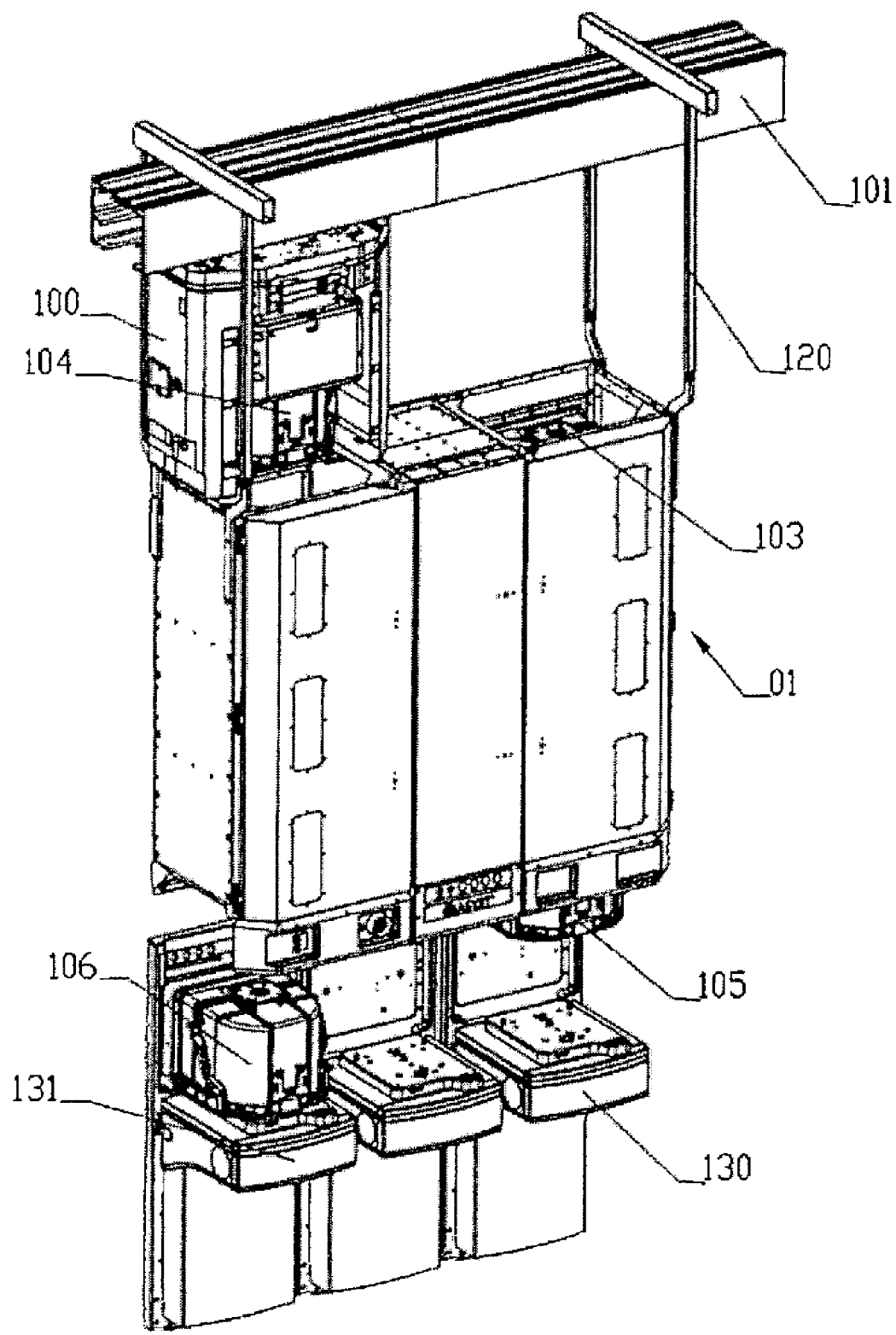
FIG. 12 is a perspective view of the buffer hanging from an OHT rail above three load ports.

Referring to FIG. 12, buffer 01 is suspended by overhead transport rail 101 in a suspended position 120. Overhead transport vehicle 100 is configured to deliver and/or to retrieve work piece container 104 from input/output positions in buffer 01. Work piece container 103 is in position to be retrieved from buffer 01 by overhead transport vehicle 100 (or another vehicle which is configured to approach buffer 01 on overhead transport rail 101).

At a bottom of buffer 01, work piece container 105 is held by a transport device (not shown) that may be configured to lower work piece container 105 onto load port 130 and/or to retrieve work piece container 105 from load port 130. The transport device can move between load ports to deliver and/or to retrieve work piece containers. Work piece container 106 on load port 131 is available to be retrieved by the transport device (not shown). Hanging structure 120 may be supported by overhead transport rail 101 or by another mounting to a higher elevation structure, including, e.g., a ceiling, a roof, building steel, and so forth.

Figure 13:
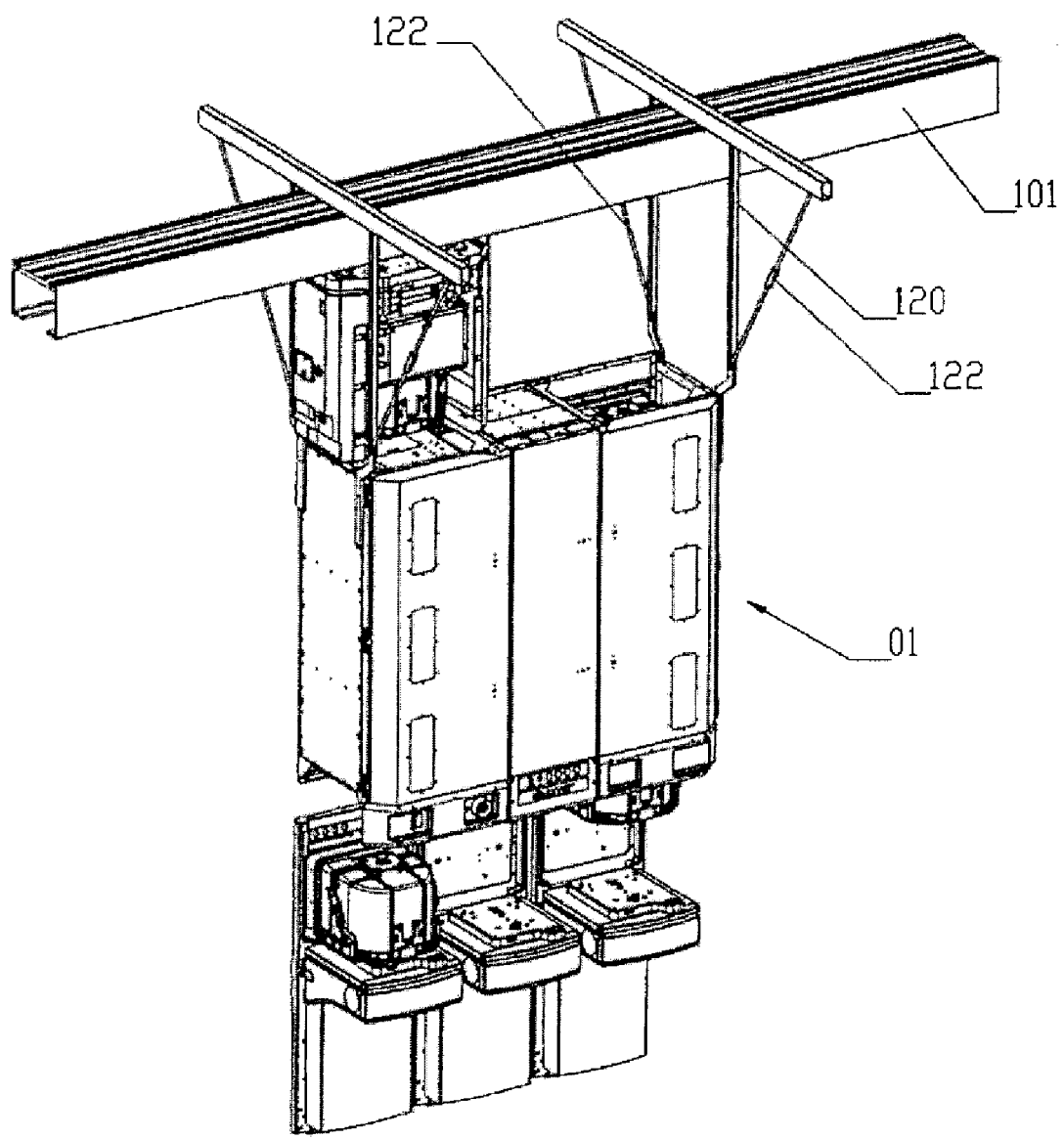
FIG. 13 is a perspective view of the buffer hanging from an OHT rail with Y axis adjustment.

Referring to FIG. 13, adjustment mechanism 122 is configured to move hanging direction in a direction along a y-axis (e.g., toward and away from a process tool). In the illustrative example of FIG. 13, adjustment mechanism 122 includes a front and a back pair of rods with turnbuckles. By adjusting the front rod shorter and the rear rod longer, buffer 01 may be moved away from a tool and/or a load port. By adjusting the front rod longer and the rear rod shorter, buffer 01 may be moved toward the tool and/or the load port.

Buffer 01 is configured to be suspended from a ceiling, an overhead transport rail, and a process tool. Buffer 01 may also be configured to be mounted on a floor of a fabrication facility.

Figure 14:
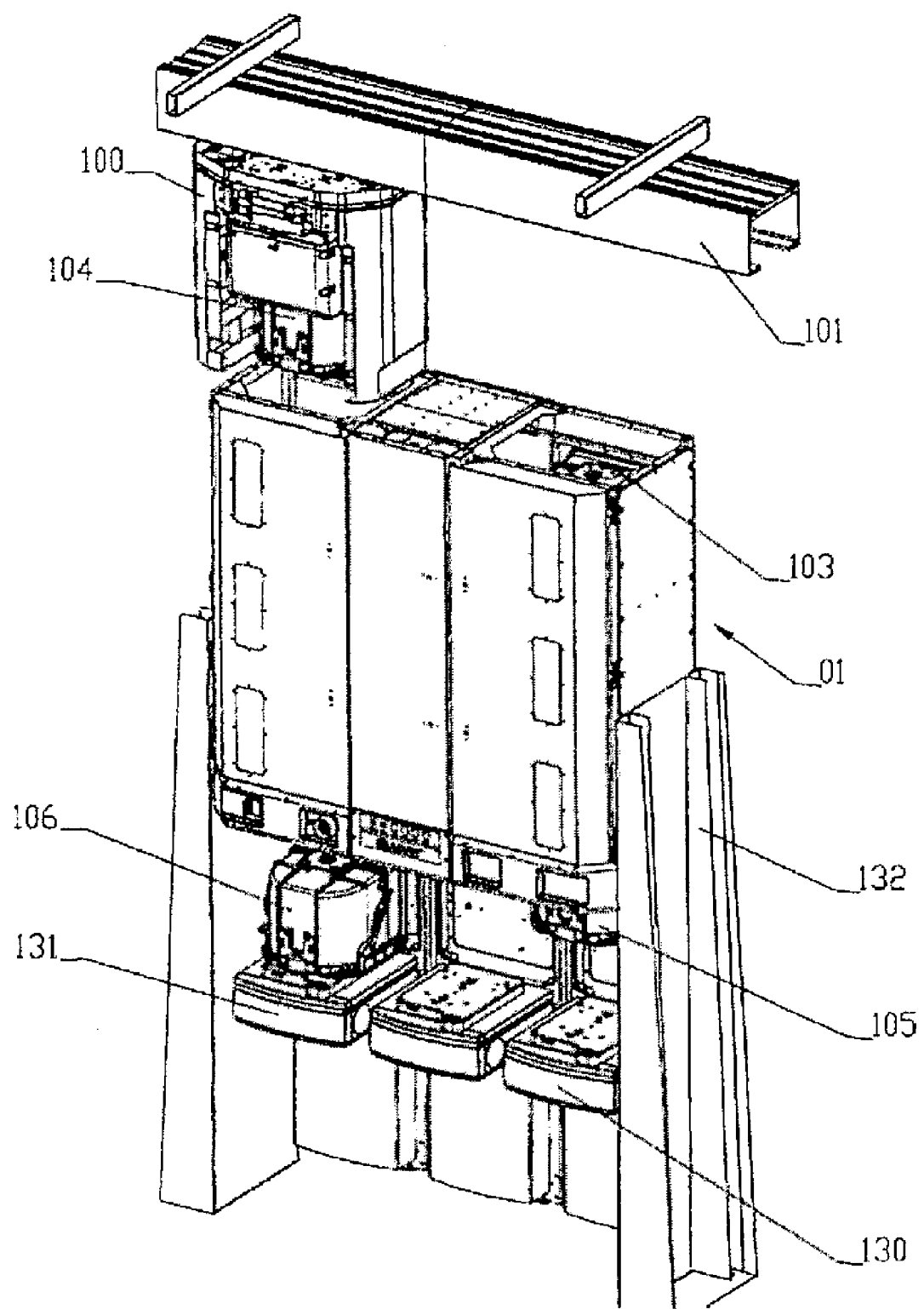
FIG. 14 is a perspective view of the buffer supported from the floor.

Referring to FIG. 14, buffer 01 is positioned in a floor mounted position. Floor mount 132 is configured to support buffer 01 from the sides to permit free access to the load ports below by an operator, an automated guided vehicle ("AGV"), a floor mounted rail guided vehicle ("RGV"), and so forth. A load port may be removed from the process tool without removing buffer 01, e.g., for servicing of the load port or an Equipment Front End Module ("EFEM").

Figure 15:
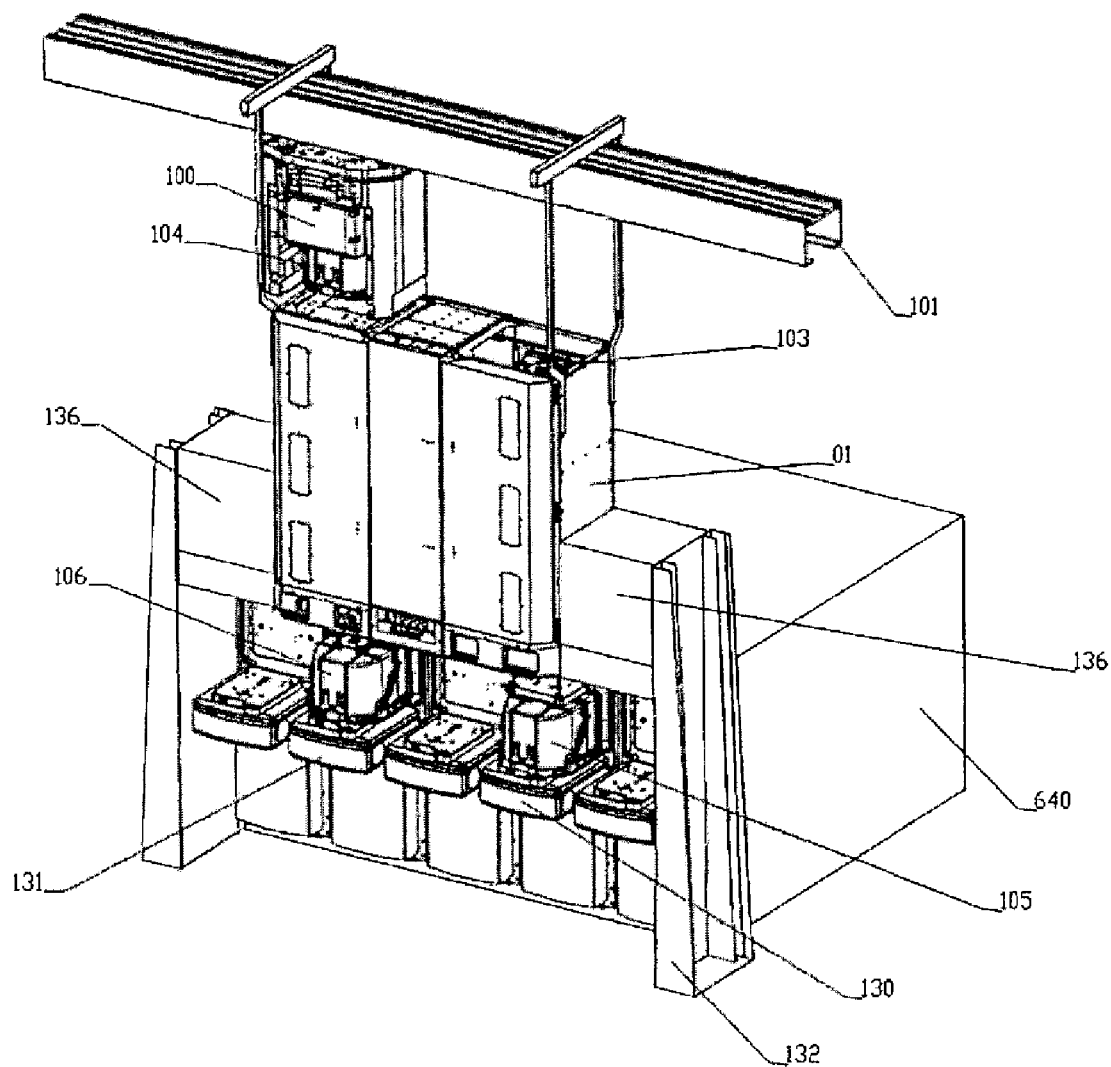
FIG. 15 is a perspective view of the buffer with optional side wings and a floor stand to provide coverage for 4 or 5 load ports.

Referring to FIG. 15, buffer 01 includes side wings 136, which are configured to permit a transport device (not shown) to travel along a bottom of buffer 01 across additional load ports. In the illustrative example of FIG. 15, process tool 640 includes a width corresponding to five load ports. Process tool 640 uses side wings 136 to permits the transport device to move in a horizontal direction, e.g., in an X direction, above the load ports. Process tool 640 also uses side wings 136 to permit the transport device to be elevated by an elevator. In the illustrative example of FIG. 15, sufficient vertical clearance exists for a work piece container that is being carried by the transport device to clear work piece container 106 that is sitting on load port 131. The foregoing configuration permits random access to work piece containers on load ports.

Figure 16:
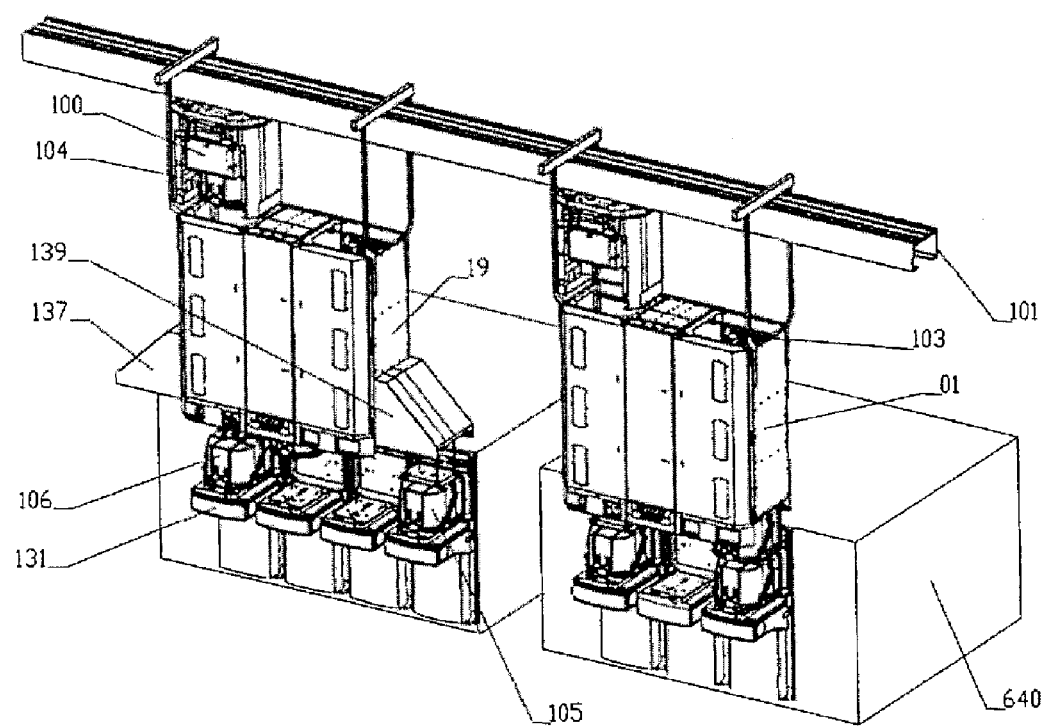
FIG. 16 is a perspective view of the buffer with alternative optional side wings.

Referring to FIG. 16, buffer 01 is configured to fit a tool with a various number of load portson the right has no extension and fits a tool with 1, 2 or 3 load ports. The buffer 19 on the left has two extensions, left extension 137 and right extension 139, shown which permit the buffer servicing load ports on a tool which is 1 thru 5 load ports wide and could alternatively service two side by side tools with a total of up to 5 load ports. The buffer supports zero wings or extensions, one left extension, one right extension, or both one left and one right extension.

Figure 17:
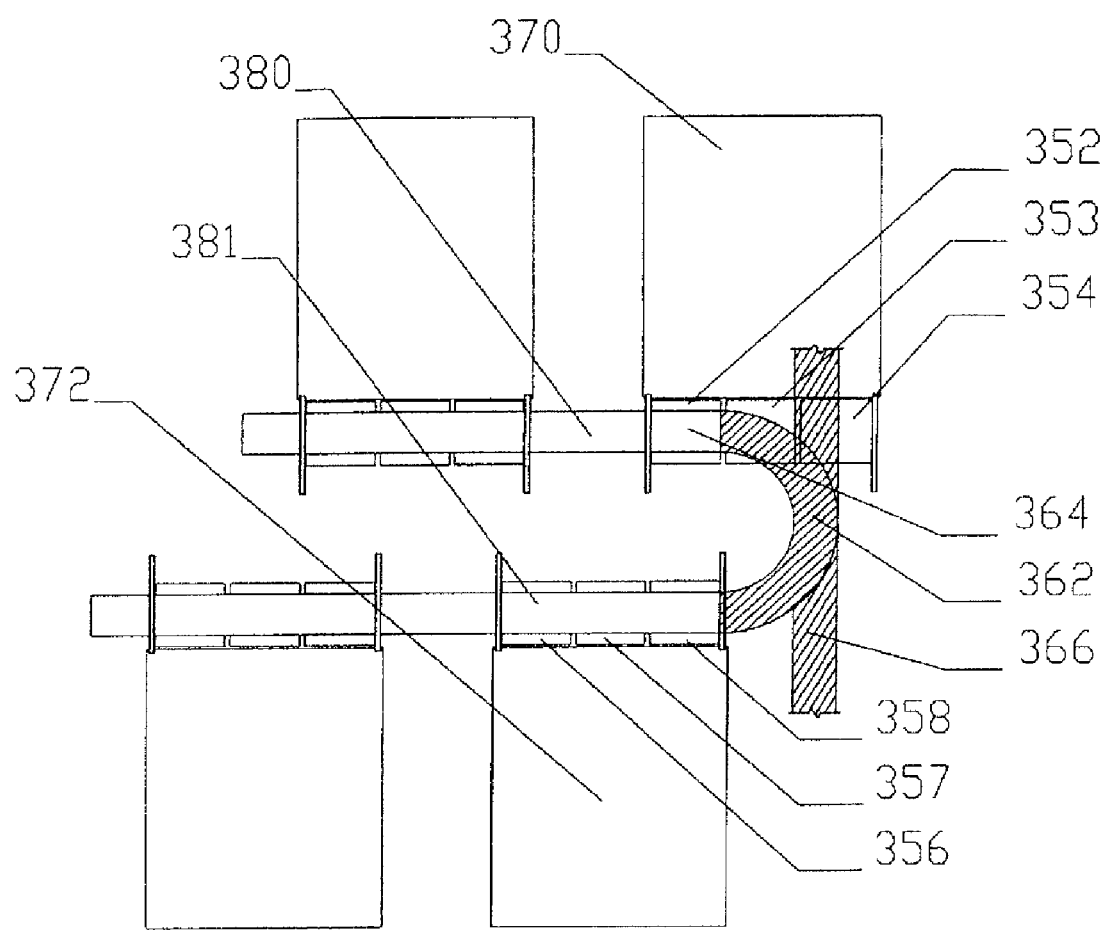
FIG. 17 is a top view of a fabrication facility process aisle.

The buffer provides a mechanism to extend the useable manufacturing process aisle. FIG. 17 shows the top view of a typical manufacturing process aisle. Process tool 372 is located in the last possible position under the overhead transport rail 381 where all three load ports are reachable. Locating tool 372 farther to the right (toward 366 the cross bay overhead transport rail connector) in the process aisle, one or more load ports 358, 357, and 356 would then be under the shaded region 362 of the overhead transport rail where drop off or pickup containers from an OHT to a load ports is not possible.

Tool 370 has a buffer located over its load ports 352, 353, 354. If the tool is moved such that only one load port position 352 is under the overhead transport rail 380, all three load ports remain accessible because the buffer can transport via the transporter to the other two load port positions. This provides a key advantage of the buffer technology in that it permits usage of the process aisle linear floor space that was previously unavailable for process tooling. Thus one can achieve higher density in a manufacturing facility amortizing the cost of the facility over more equipment.

The buffer when equipped with the side wings and straight sections can extend this space 2, 3, 4 or more load port widths beyond the end of the overhead transport rail possible drop off positions.

Figure 18:
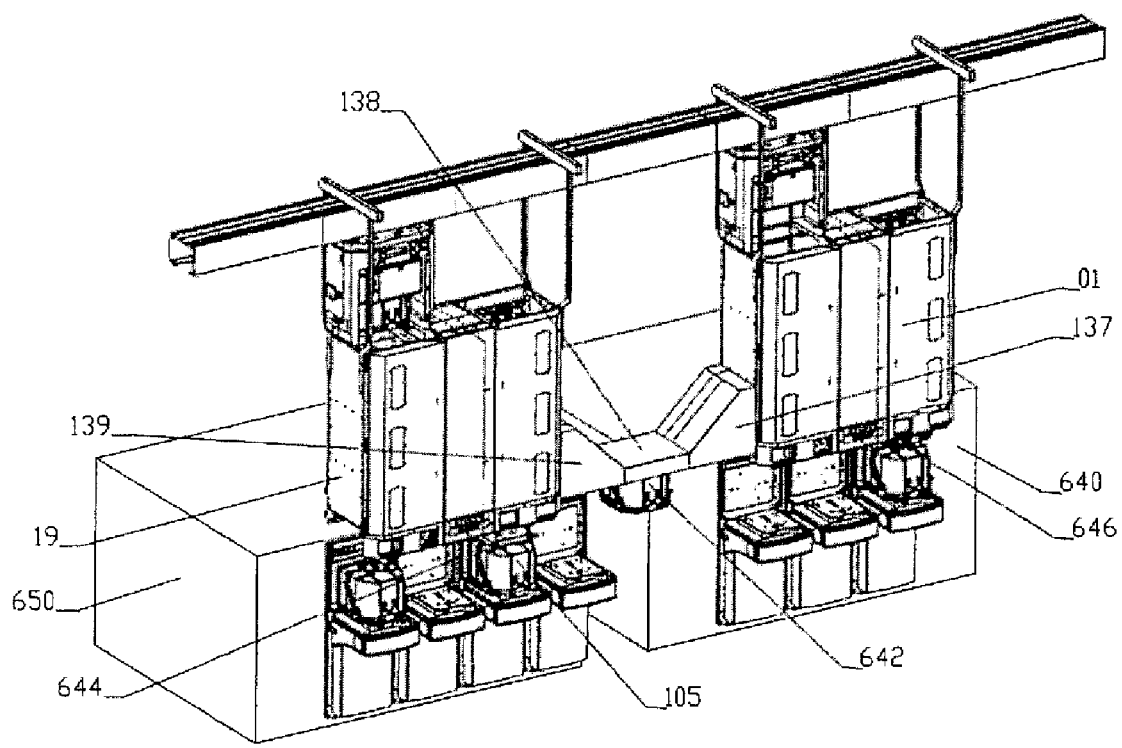
FIG. 18 is a perspective view of the buffer with optional side wings.

The buffers 01 and 19 can be connected together by using a straight section with rail 138 on which a transport device 642 can travel between buffers. Additionally, a left buffer extension 137 and a right buffer extension 139 can be used in combination with zero, one or more straight sections 138 to connect multiple buffers. Multiple transport devices are permitted within a buffer or on the rail at the base of a buffer and can travel between buffers. FIG. 18 shows three transport devices on the bottom rail under the buffer. The left transport device 644 is hoisting a work piece container 105 from tool 650. The center transport device 642 is traveling between buffers with a work piece container. The third transport device 646 is holding a work piece container above the right most load port on tool 640.

Figure 19:
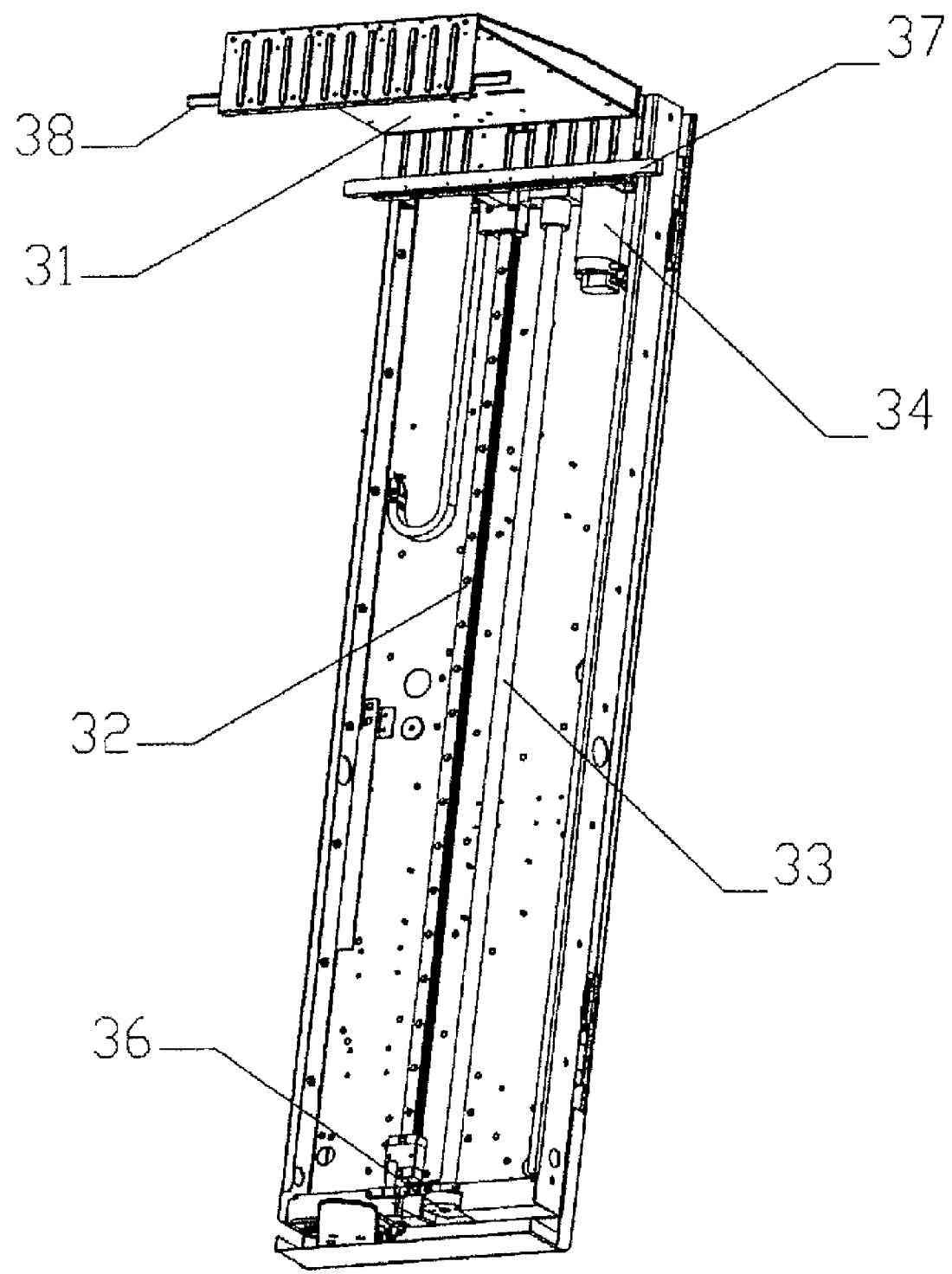
FIG. 19 is a perspective view of the elevator mechanism of the buffer.

As shown in FIG. 19, the elevator mechanism consists of an elevator carriage 31 which is guided by a linear bearing guide 32 and is moved by a ball screw 33. The ball screw 33 is rotated by an elevator motor drive 34. The position of the carriage in the elevator column in height (Z direction) is controlled via the use of appropriate electronics and feedback from the elevator encoder 36.

The elevator carriage includes the transport device's support front rail 37 and rear rail 38 which align to the appropriate level in the buffer to allow the transport device to roll off of the elevator carriage onto a shelf at that level and vice versa.

Figure 20:
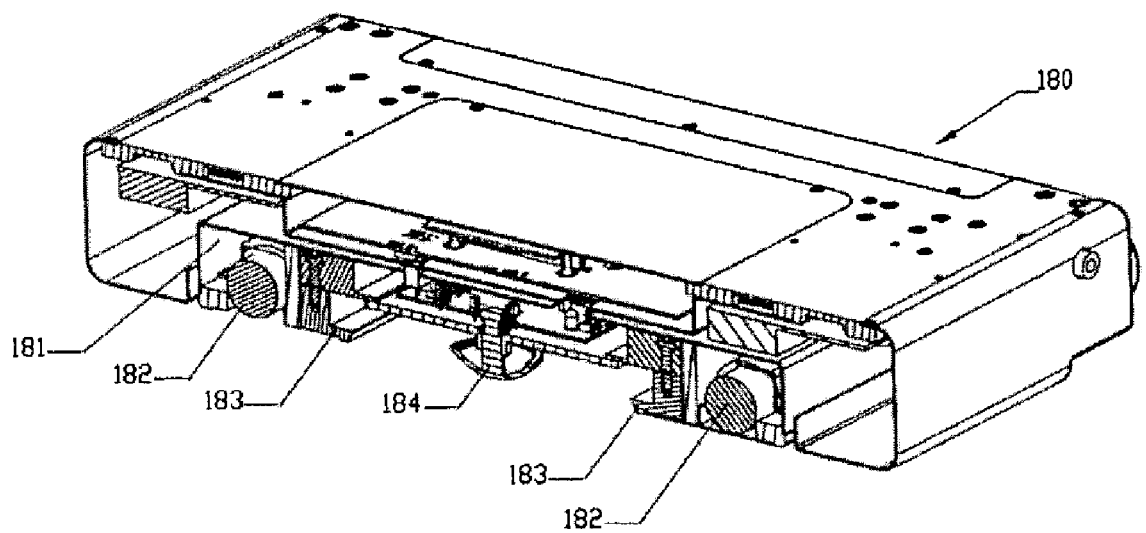
FIG. 20 is a perspective cross sectional top view of the transport device.

The transport device 180 has been sectioned and is shown in FIG. 20. The gripper 181 fits inside the transporter when retracted. The gripper 181 has two jaws 183 that capture the work piece carrier. The gripper 181 also includes a sensor that uses a mushroom shaped plunger 184 to detect the presence, absence, proper capture of, and improper capture of a work piece container. The transport device, in this configuration, is a battery powered device with batteries 182 located such that the center of gravity is maintained with and without a work piece container.

Figure 21:
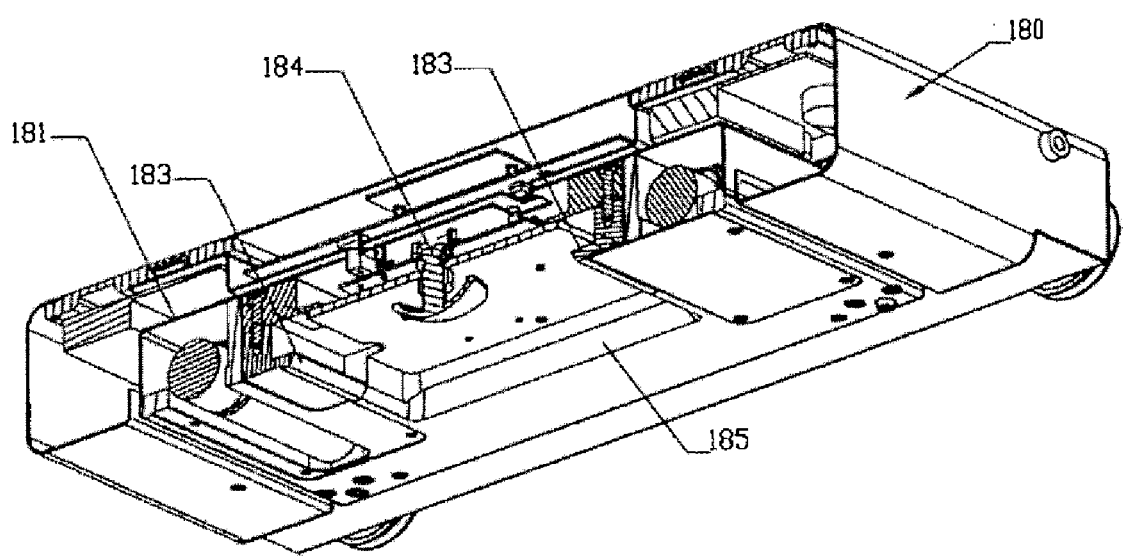
FIG. 21 is a perspective cross sectional bottom view of the transport device.

FIG. 21 shows the transport device 180 tilted up to show the underside of the device and in particular to show the work piece container robotic handling flange guide 185 which is used to ensure proper alignment of the gripper to the flange as it is lowered to capture the work piece container.

The opening for the work piece container's robotic handling flange is limited in size such that when the flange enters the gripper, guided by the guide 185, it is captive in the X and Y directions (these directions form a plane parallel the top of the transport device 180. When the gripper is closed, the flange is now captive in the Z direction. Once closed, no motor power is required to maintain captivity of the flange as the lead screw thread angle is sufficient to prevent the jaws from back driving the motor to open without energizing the motor appropriately.

Figure 22:
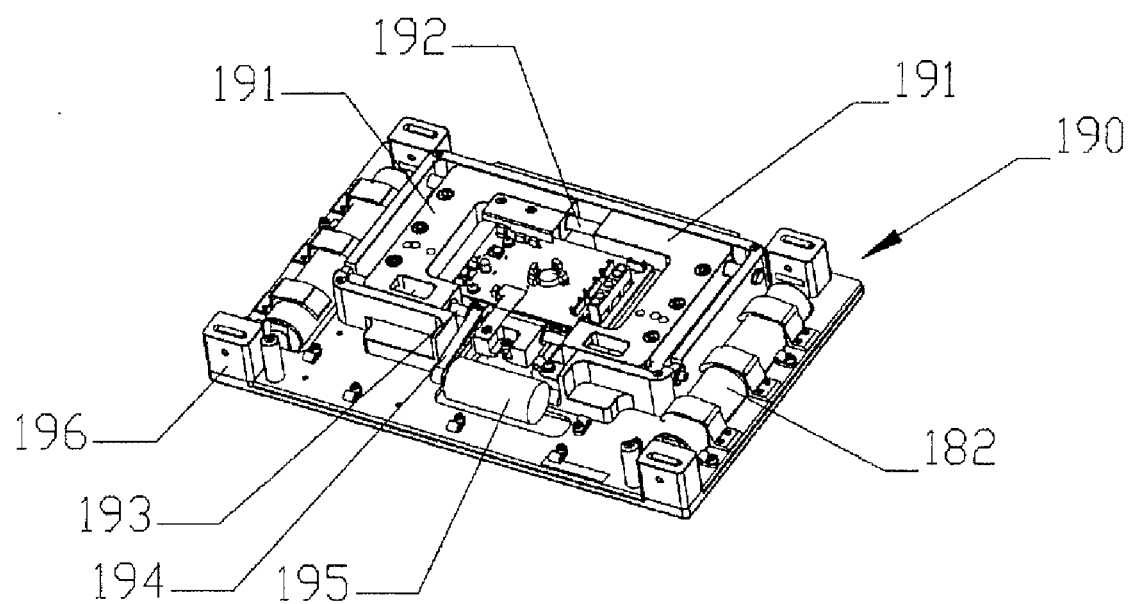
FIG. 22 is a perspective top view of the gripper mechanism.

FIG. 22 shows the gripper mechanism 190 with the covers removed. The gripper 190 consists of a pair of moveable jaws 191 that are closed to capture the work piece container top hat. The jaws are guided by the jaw guide 192 and driven closed or open via a lead screw 193. The lead screw 193 is driven by a motor 195 through a drive belt 194.

The gripper is suspended from the transporter via four flat belts which are attached to the gripper 190 via a hoist belt clamp 196 located in each corner of the gripper.

Figure 23:
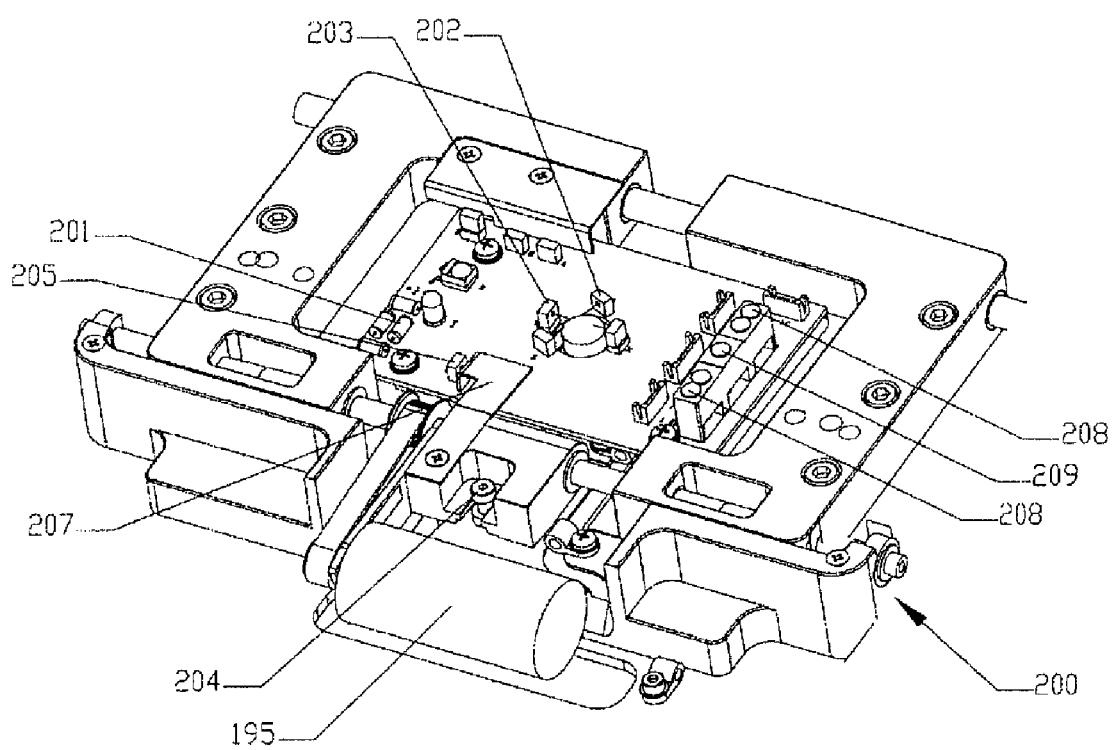
FIG. 23 is a perspective detail top view of the gripper mechanism.

A more detailed view 200 of the gripper 190 is shown in FIG. 23. The gripper has two X and two Y tilt sensors 201 to detect the gripper out of horizontal alignment. This can be caused by the gripper being improperly lowered onto a work piece container robotic handling flange where one side of the gripper rests on the work piece container body and the opposite side rests on the work piece container robotic handling flange resulting in a situation where proper gripper action to capture the flange in the gripper is not possible. This same condition can occur when a work piece container is improperly placed on a load port's kinematic pins causing the work piece container to be out of alignment with the proper positioning of its flange for capture by the gripper.

Additionally, the tilt sensors 201 can detect the impact of the transport device with an obstruction. The gripper uses two sensors 202 and 203 to detect proper capture and release of a work piece container.

The jaw motor 195, torque limit flag 207 and assembly incorporates a motor torque limiting feature to provide a stop signal when the gripper force reaches a preset limit. In one example, as the jaw motor 195 drives the gripper jaws 191 closed, the jaws reach a stop at the end of travel. In another example, the jaws will clamp on the work piece carrier robotic handling flange. The motor torque continues to increase and thus the motor assembly begins to rotate about the lead screw axis. This torque is opposed by an adjustable counter force spring assembly 204. The motor torque causes the rotation of the motor assembly to compress this spring and force the flag 207 to rotate into an optical break the beam sensor and provides the proper signal to the motor controller to halt the motor's movement. Thus, the clamping force on the work piece containers robotic handling flange can be controlled to provide proper clamping to capture the flange but allow it to float freely over a small range in the Z height. This permits the flange to drop to the lower most surface of the jaws as the gripper is raised and this motion is used to confirm proper capture of the work piece container.

Power to charge the gripper batteries are provided via contact pins 208 and 209 from the Transporter. Contact is first made via pin 209 to discharge any static that may have accumulated while the gripper was lowered from the transport device.

Figure 24:
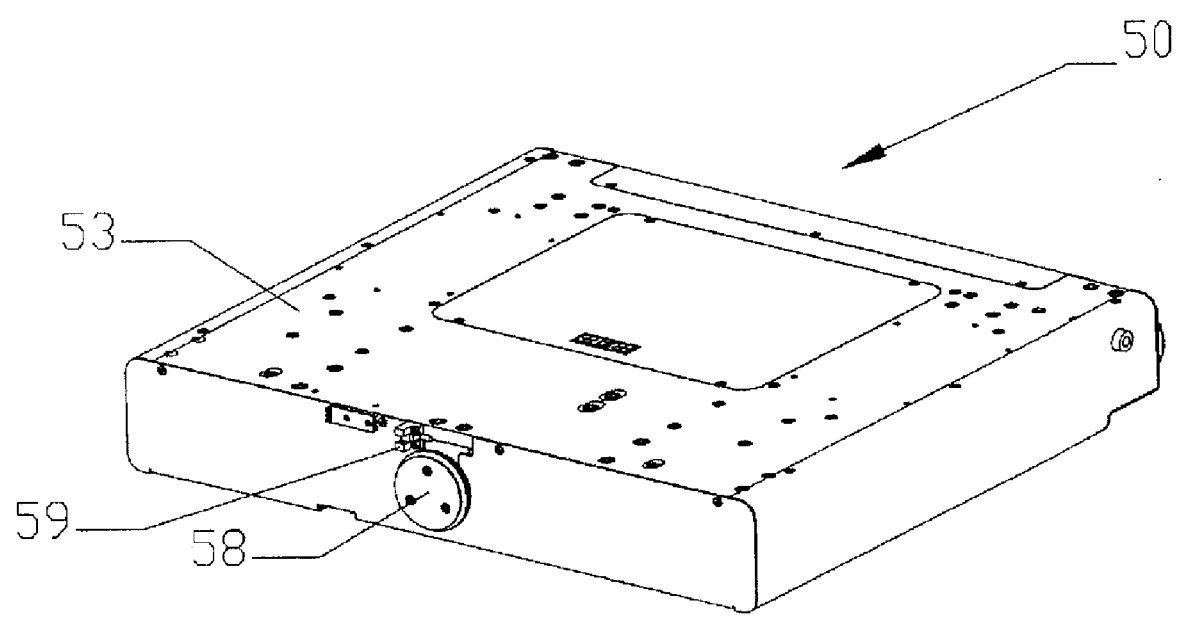
FIG. 24 is a perspective view of a home sensor of the transport device.

Transporter 50 has a home sensor for each axis. The X axis home sensor 59 on the transporter body 53 is shown in FIG. 24.

Figure 25:
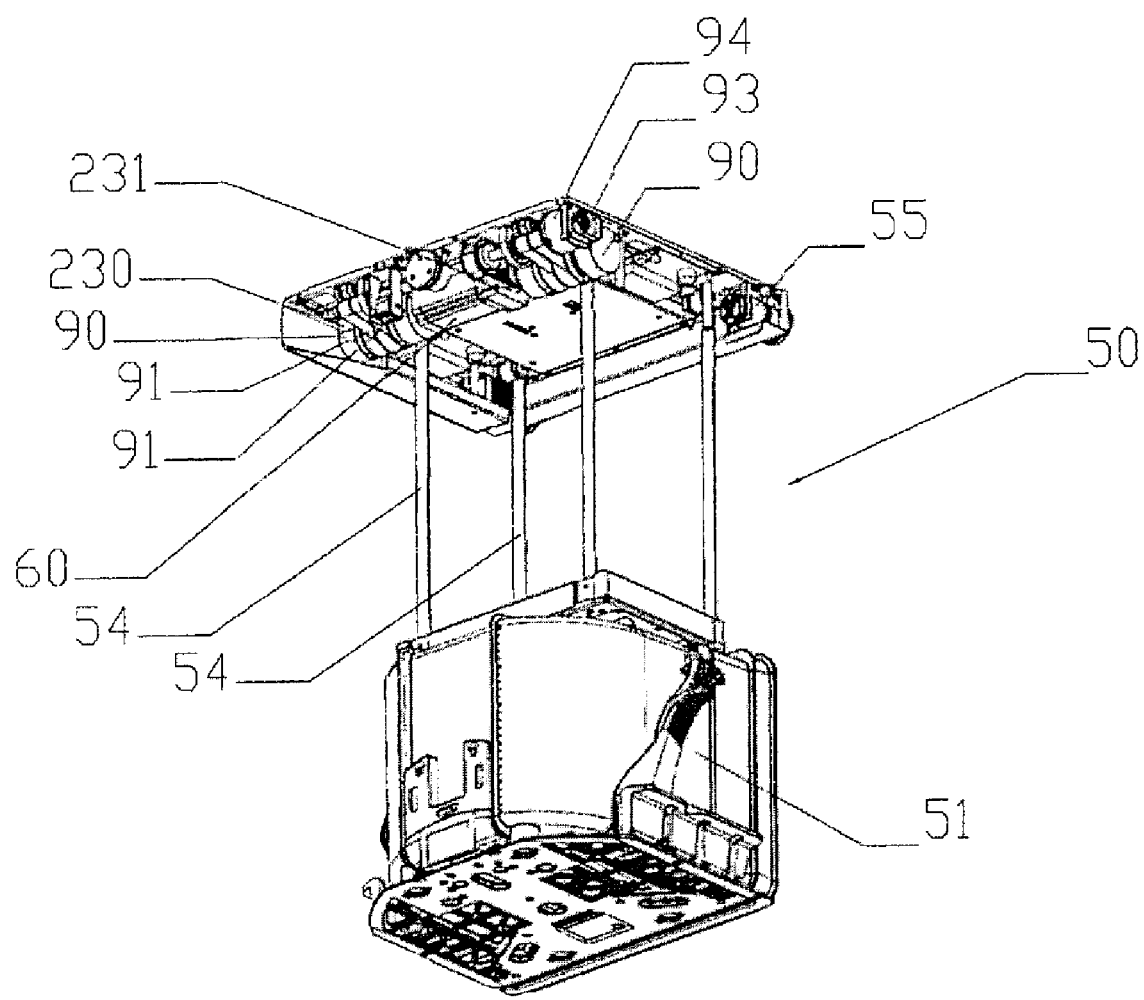
FIG. 25 is a perspective view of the transport device with covers removed.

The transporter 50, in FIG. 25, houses the hoist mechanism consisting of a set of four hoist belts 54, a hoist motor 60, a transmission belt 231 to couple the motor 60 to the hoist belt drive shaft, slack belt tension wheels 92 (shown on next figure) to keep the hoist belt engaged. The hoist belts 54 are connected to the gripper 52 which captures and releases work piece containers 51. The slack side of the hoist belt 91 is wound up onto a spool via a take-up main spring 90 housed inside of a hoist belt tensioner housing 230. The hoist encoder 93 provides positional information in the Z-axis (height) and the hoisting mechanism can be locked at any position via the hoist brake 94. The X-axis encoder and brake assembly 55 provides transporter X position feedback and provides a mechanical lock to prevent movement in the X-axis.

Figure 26:
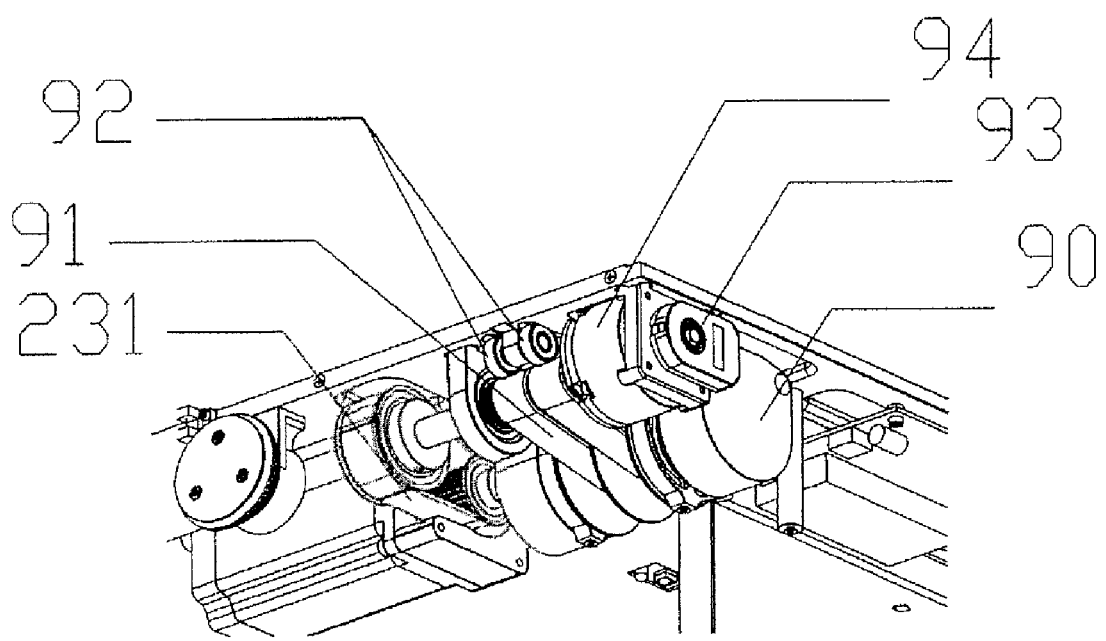
FIG. 26 is a perspective view of the transport device hoist mechanism.

The transporter hoist mechanism is shown in FIG. 26. The main take-up spring is housed in an enclosure 90 which winds up the slack 91 in the hoist belt. Two tensioner wheels 92 provide the clamping force between the drive sprocket and the belt. This is particularly important in moving a gripper with no work piece container. The hoist mechanism is locked into a position via the brake 94 and the precise position of the gripper height is determined by the hoist encoder 93.

Figure 27:
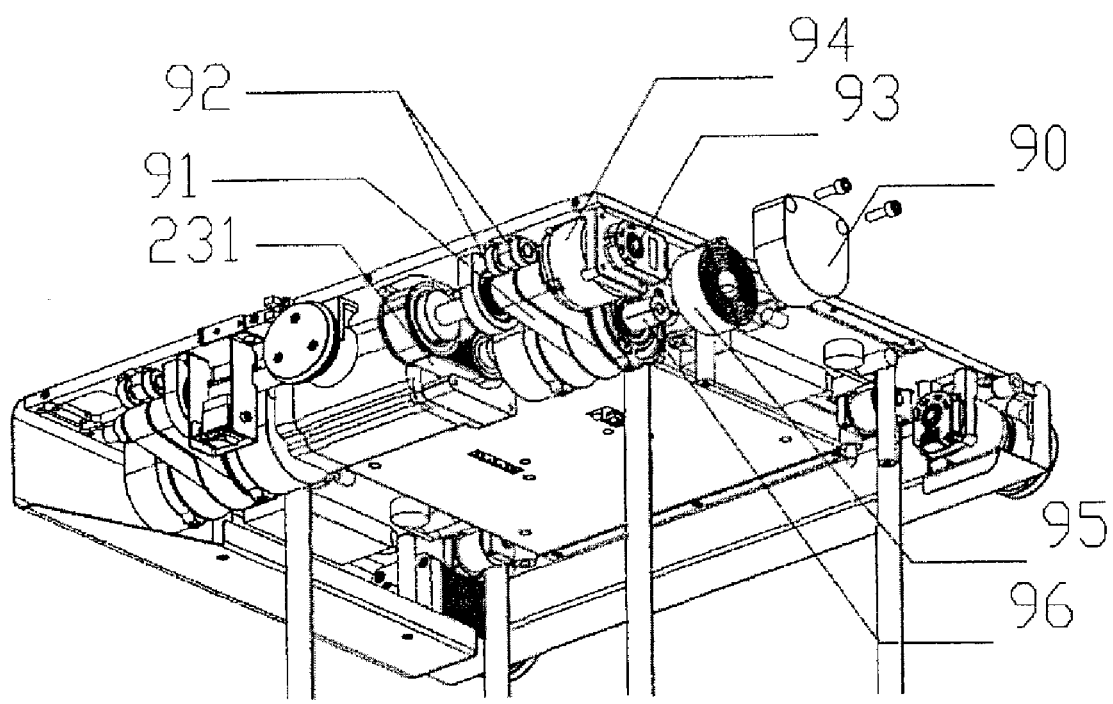
FIG. 27 is a perspective view of the transport device take-up spring mechanism.

The slack belt take-up mechanism with take-up main spring housing 90, take-up spring 95, take-up spring shaft 96 as in FIG. 27 are used to wind up the slack in the hoist belt 91 during hoist lift up.

Figure 28:
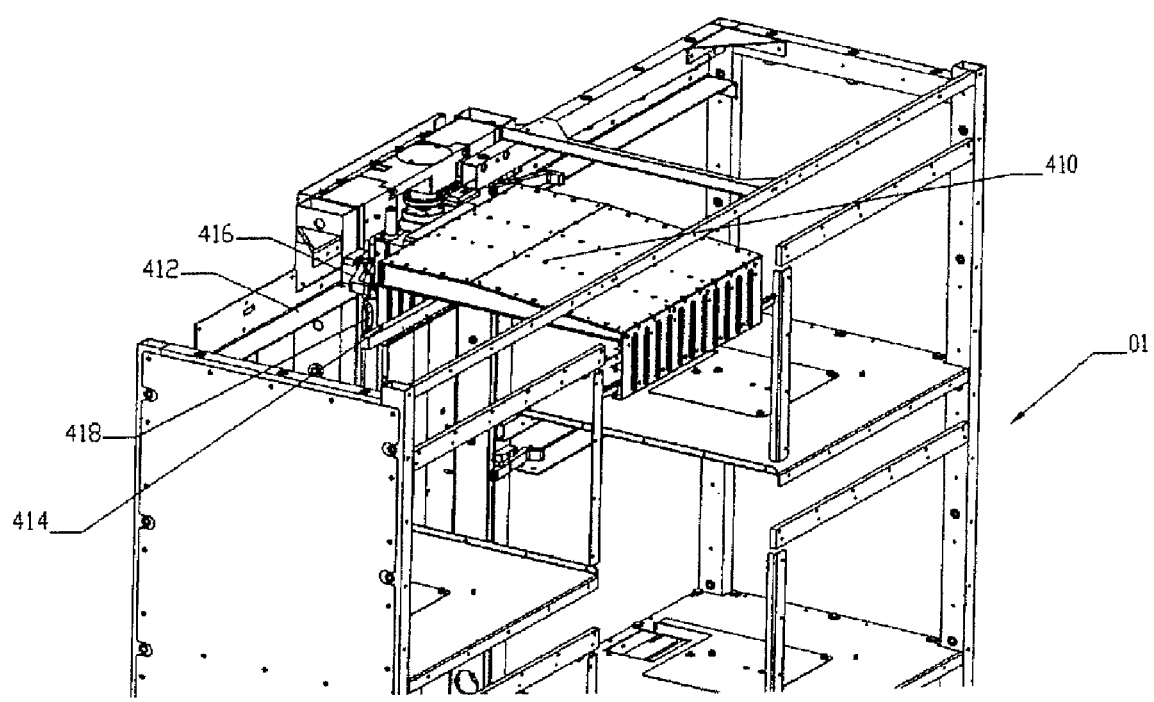
FIG. 28 is a perspective view of the buffer with interlock arms.

The buffer 01 with elevator carriage 410 is shown in FIG. 28. The buffer front transporter wheel support 412 provides support for the front transporter wheel when the transporter is located over the shelf area and the elevator carriage front transporter wheel support 414 provides support when the transporter is on the carriage 410. The interlock arm 416 blocks the movement of the transporter from the shelf to the elevator column in the event that the elevator carriage is not at the proper level. The interlock arm 416 is moved to allow the transporter to travel onto the carriage by the X axis movement interlock actuation cam 418. The action of the mechanism is effected by an interlock arm cam follower roller 420 engaging the cam 418.

Figure 29:
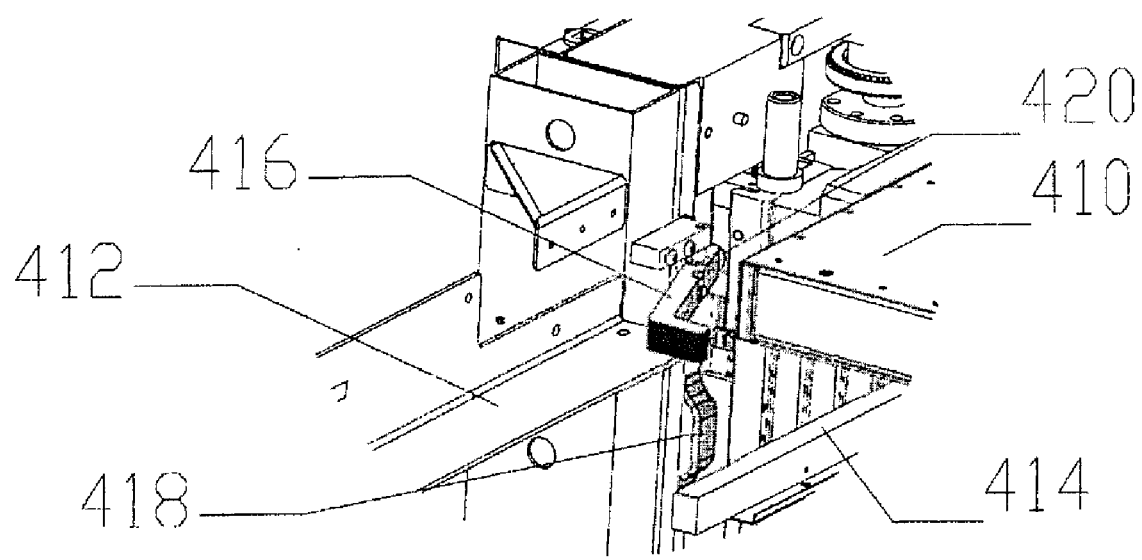
FIG. 29 is a perspective detail view of the buffer interlock arm and cam in the blocked position.
Figure 30:
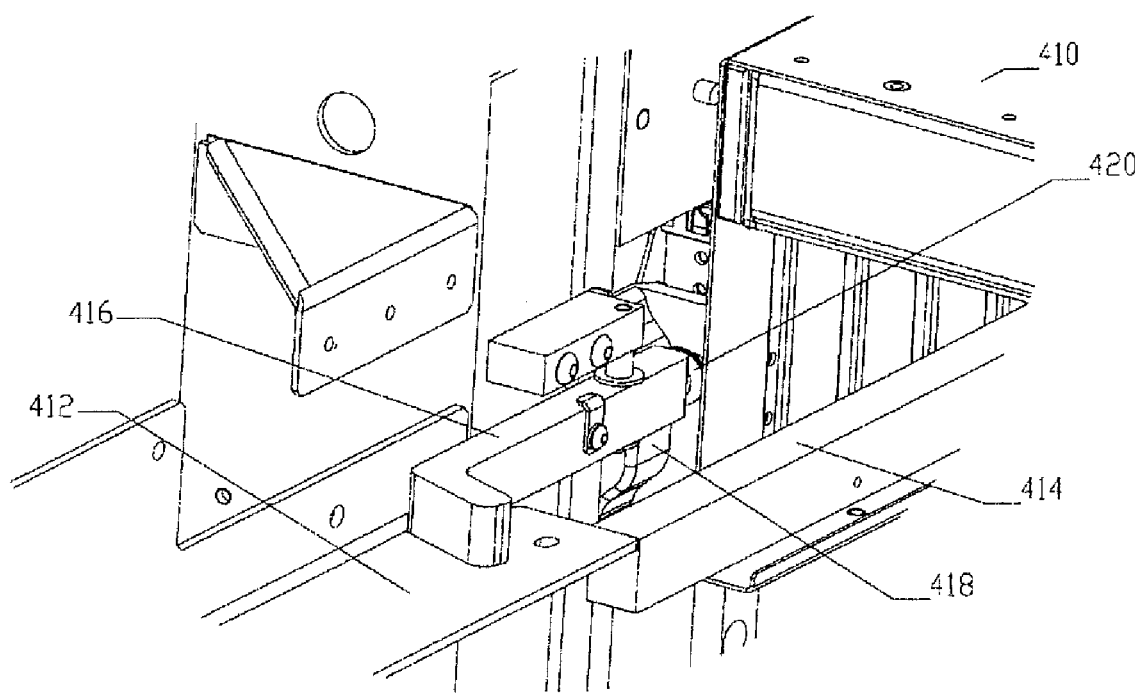
FIG. 30 is a perspective detail view of the buffer interlock arm and cam in the unblocked position.

The transporter is prevented from traveling off of a shelf and its rails when the elevator carriage 410 is not at that level by an X axis movement interlock arm 416. The transporter wheel travels along the front wheel support rail 412. The interlock arm is driven by a cam 418 attached to the buffer frame. The cam follower roller 420 engages the cam 418 as the elevator reaches the particular level moving the interlock arm 416 to a position which permits the transporter to drive past onto or off of the elevator. As the elevator leaves a level, the interlock arm 416 moves back into position as its cam follower roller 420 rolls off of the cam 418. FIG. 29 shows the interlock arm in the blocked position preventing the transporter from traveling out of a shelf area. FIG. 30 shows the interlock arm in the unblocked position.

Figure 31:
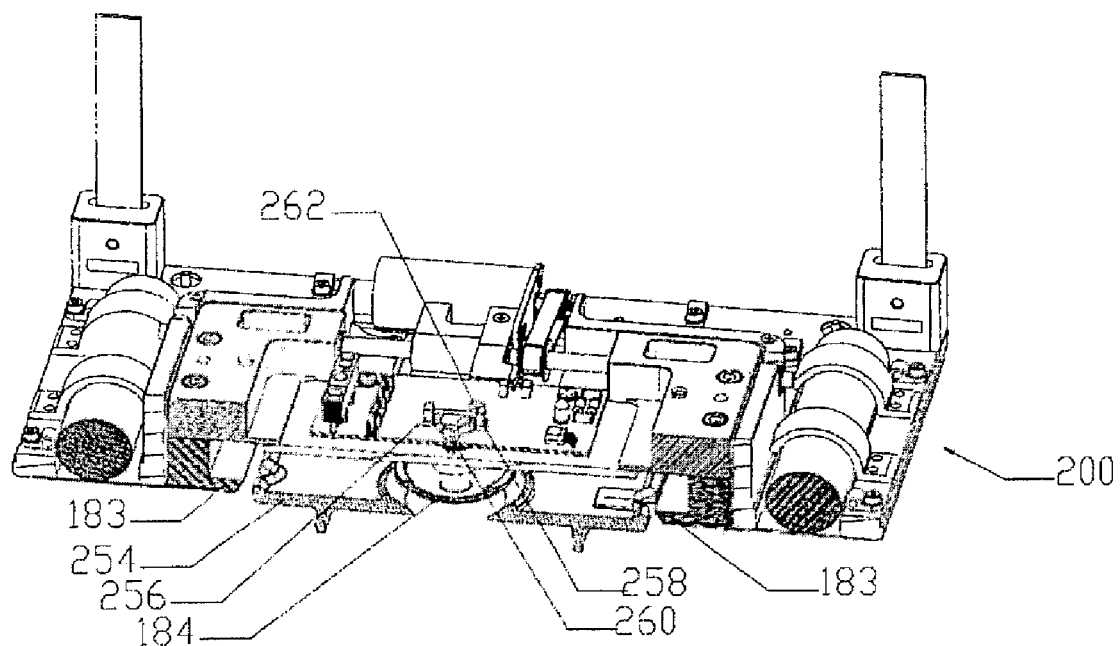
FIG. 31 is a perspective cross sectional top view of the gripper with covers removed showing the work piece container sensor mechanism with gripper approaching the container.

The work piece container sensor mechanism as shown in FIG. 31 which is housed in the gripper 200 consists of two Jaws 183 which capture the work piece container robotic handling flange 254 which is part of the work piece container, a mushroom shaped plunger 184 to activate emitter/detector sensor 256, 258 and emitter/detector sensor 260, 262 which are used to detect the absence or presence of a work piece container.

Figure 32:
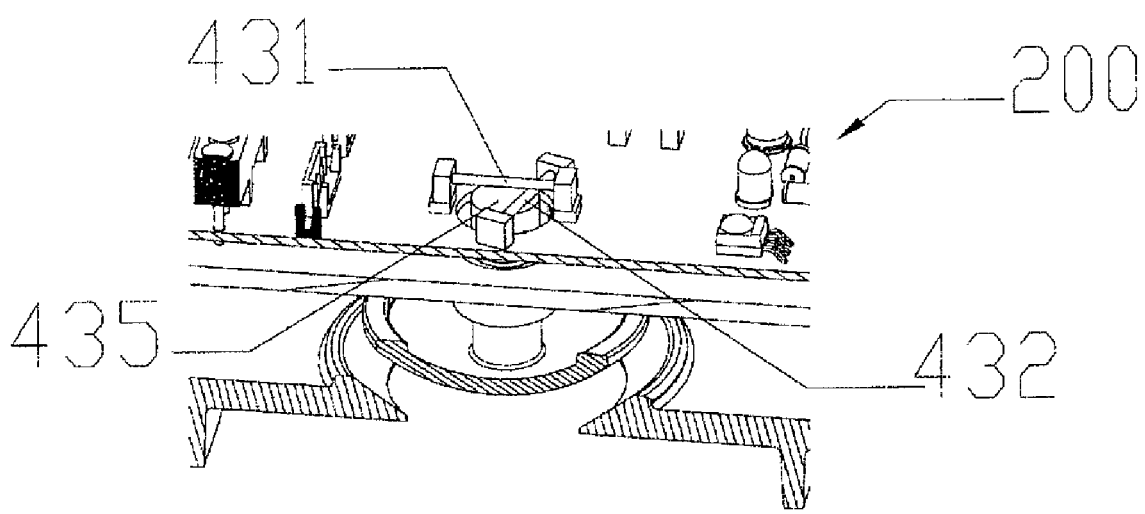
FIG. 32 is a perspective cross sectional top detail view of the gripper work piece container sensor mechanism with gripper approaching the container.
Figure 33:
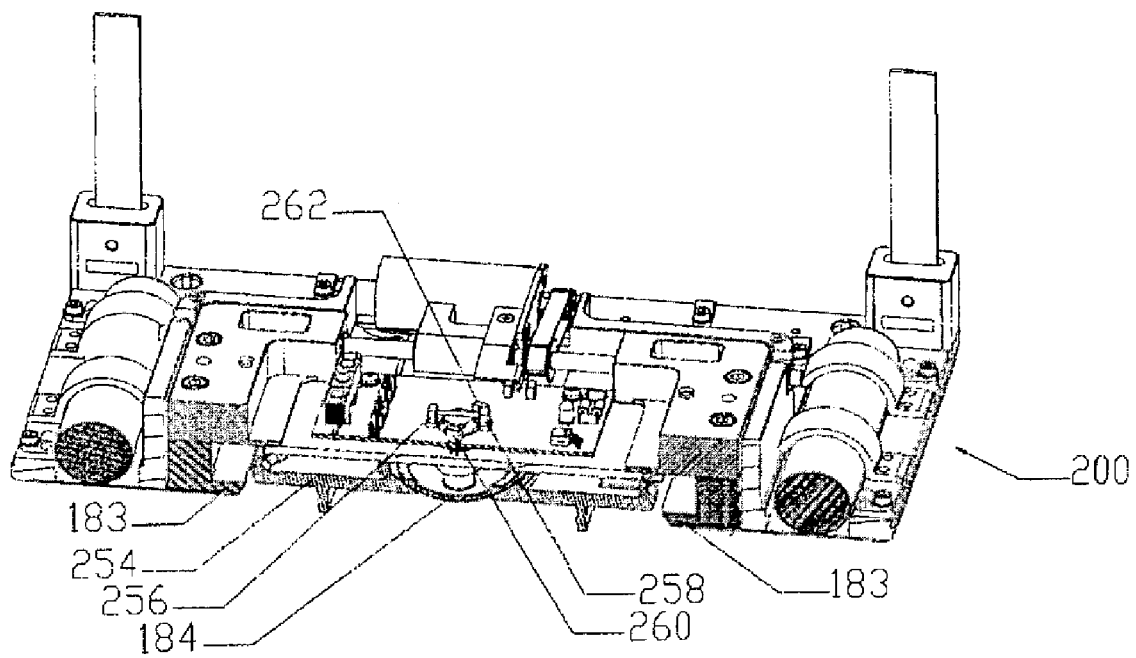
FIG. 33 is a perspective cross sectional top view of the gripper with covers removed showing the work piece container sensor mechanism with a container detected.

The emitter/detector sensor 260, 262 produces a beam 432 which can be interrupted by the stem of the mushroom plunger 184. Similarly the emitter/detector sensor 256, 258 produces a beam 431 which can be interrupted by the mushroom stem. The flat end of the mushroom stem 435 is also used as a beam interrupting mechanism as shown in FIG. 32. This figure shows the gripper fingers 183 in a retracted position and the handling flange 254 as it just prior to making contact with the mushroom plunger 184. In this position, neither beam 431 or beam 432 have been interrupted.

Figure 34:
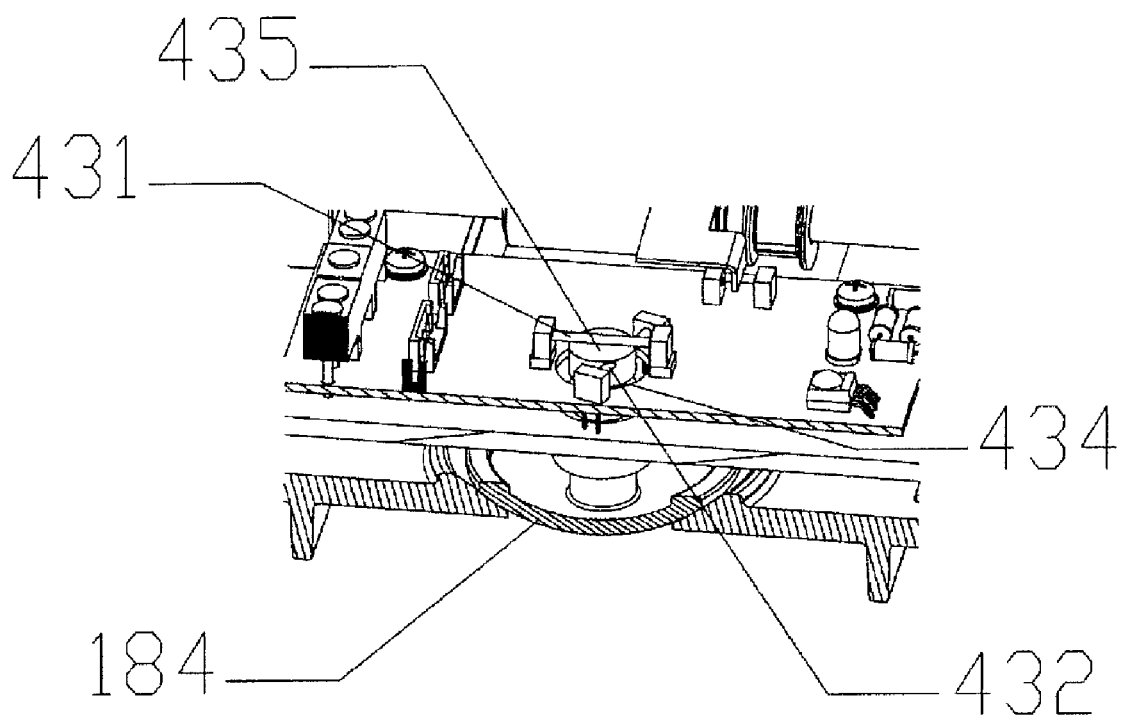
FIG. 34 is a perspective cross sectional top detail view of the gripper work piece container sensor mechanism with a container detected.

As the gripper 200 is lowered onto the robotic handling flange 254 of the work piece container, the mushroom dome contacts the recessed area of the robotic handling flange and the mushroom begins to be depressed. The beam 432 is broken as this happens signaling the detection of a work piece container as shown in FIG. 34.

The mushroom stem has a notch 434 which when depressed to the proper amount will permit beam 432 to be re-established.

Figure 35:
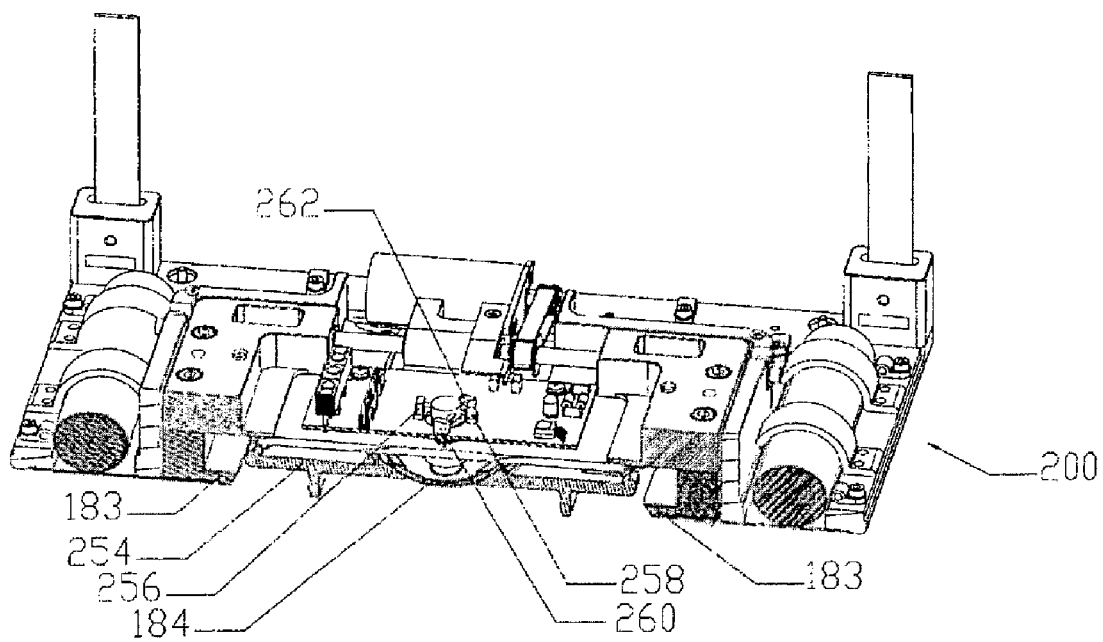
FIG. 35 is a perspective cross sectional top view of the gripper with covers removed showing the work piece container sensor mechanism at locking height.
Figure 36:
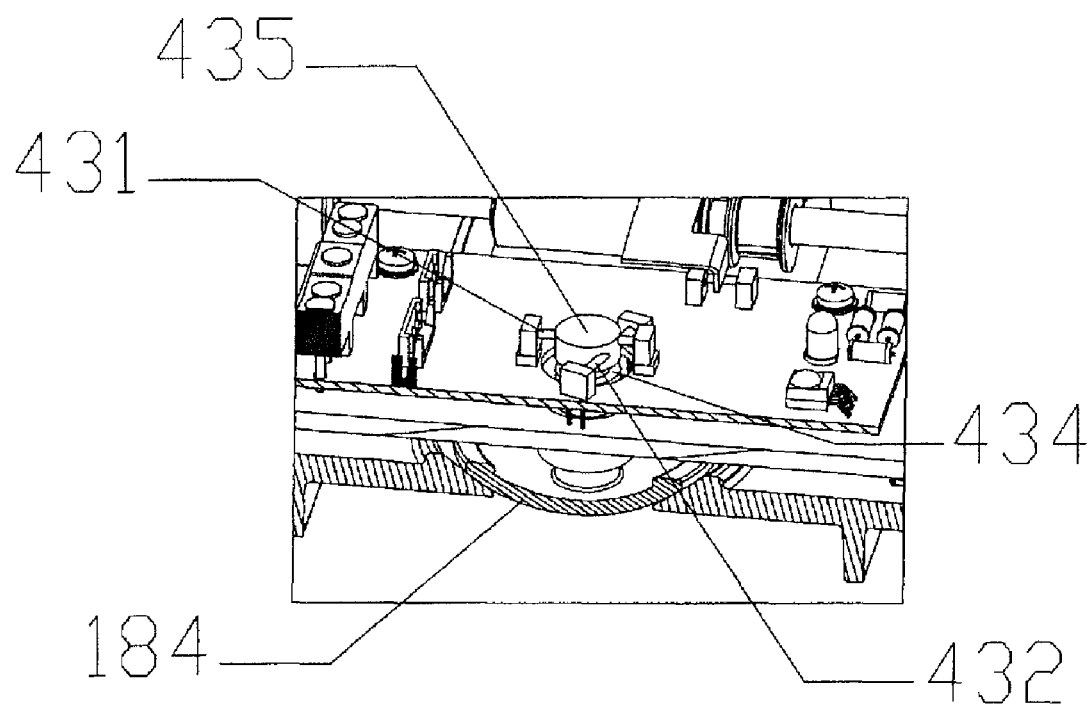
FIG. 36 is a perspective cross sectional top detail view of the gripper work piece container sensor mechanism at locking height.

As the gripper 200 continues to be lowered further, the mushroom plunger is further depressed until the beam 431 has been interrupted but the beam 432 remains interrupted as shown in FIG. 35 and FIG. 36. This signals the gripper that the robotic handling flange 254 is in the proper position to close the jaws 183 of the gripper 200.

Figure 37:
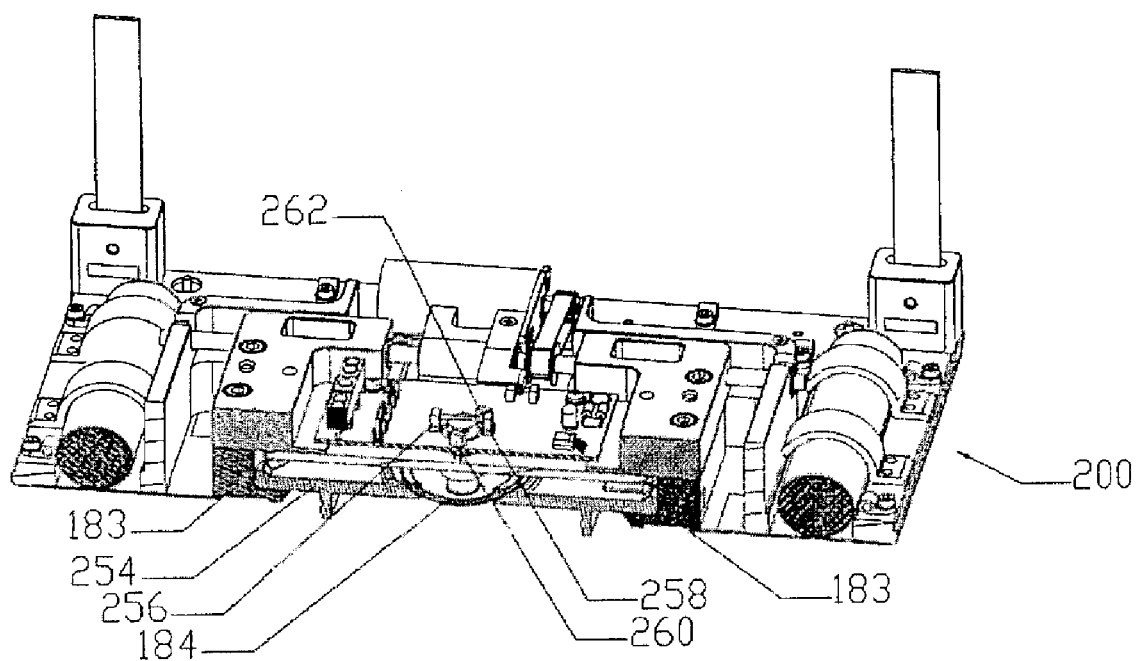
FIG. 37 is a perspective cross sectional top view of the gripper with covers removed showing the work piece container sensor mechanism with gripped container.
Figure 38:
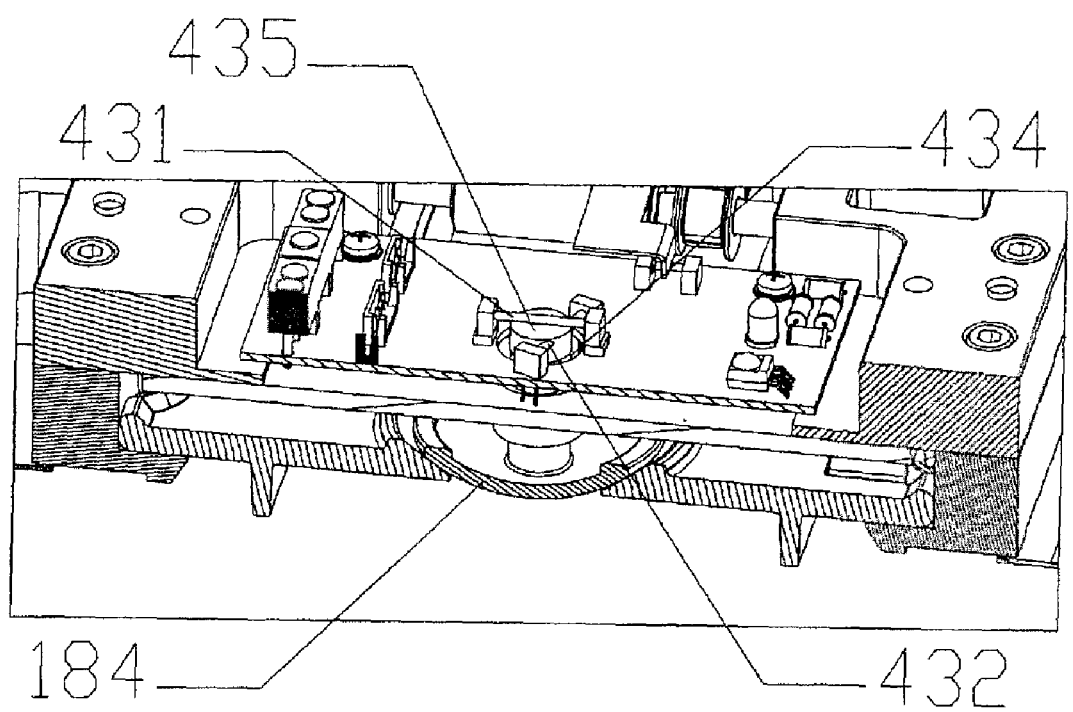
FIG. 38 is a perspective cross sectional top detail view of the gripper work piece container sensor mechanism with gripped container.

The jaws 183 are shown closed in FIG. 37 and FIG. 38. At this position the robotic handling flange 254 is fully captured by the jaws 183 and gripper body and the work piece container is now ready to be lifted.

Figure 39:
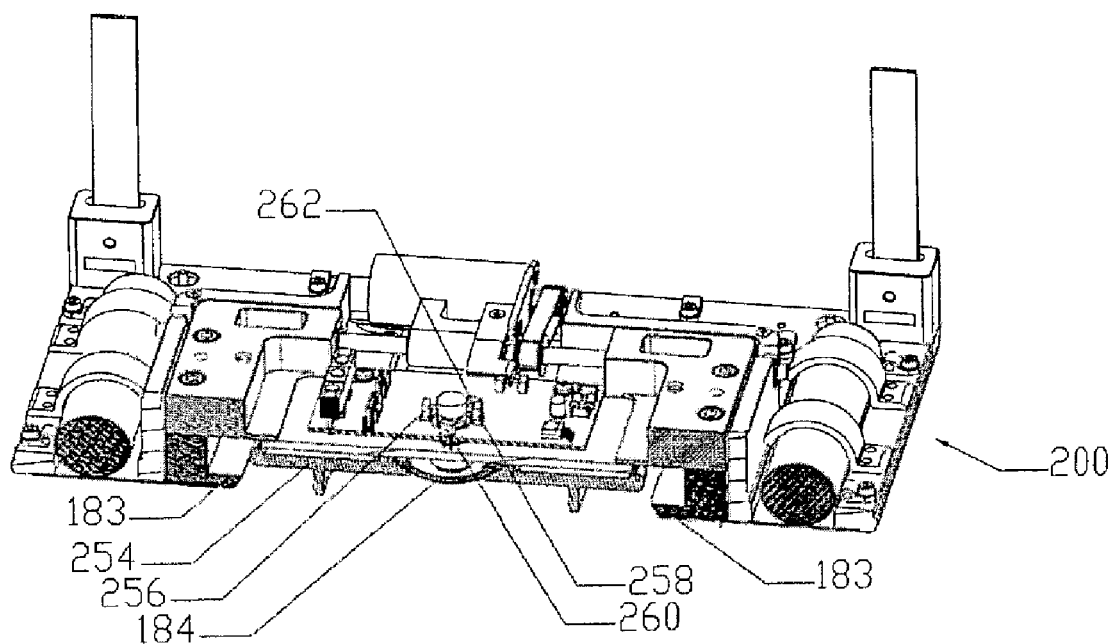
FIG. 39 is a perspective cross sectional top view of the gripper with covers removed showing the work piece container sensor mechanism with over travel detected.
Figure 40:
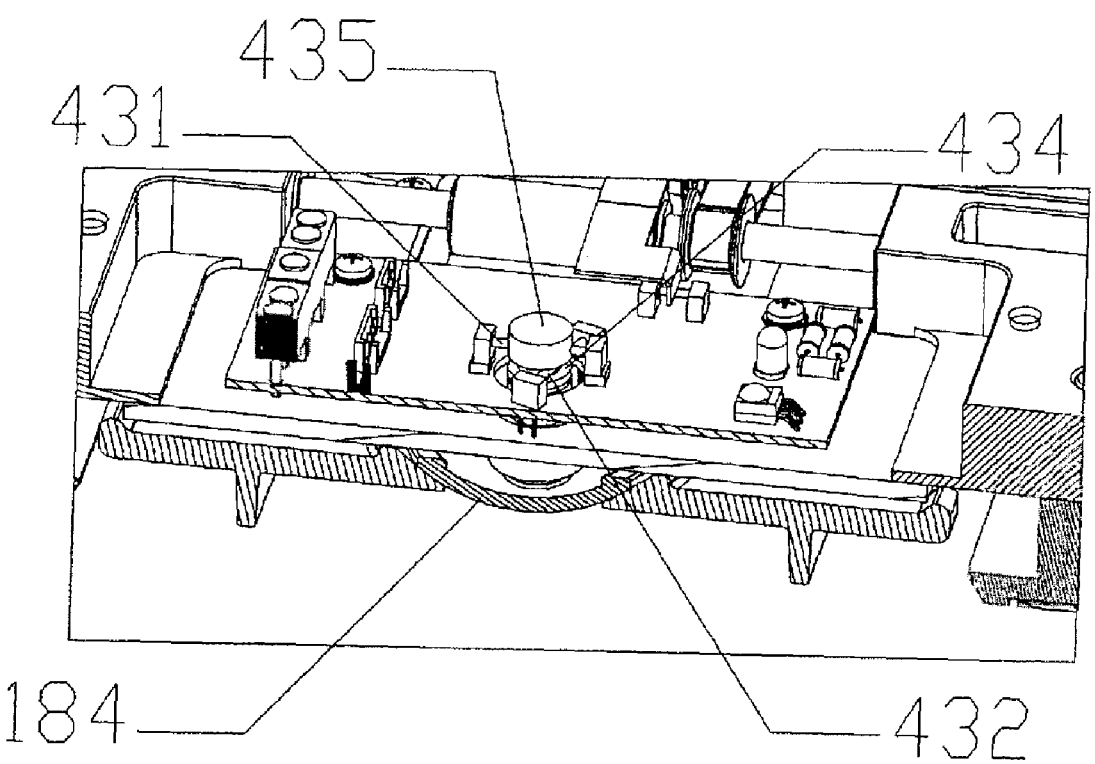
FIG. 40 is a perspective cross sectional top detail view of the gripper work piece container sensor mechanism with over travel detected.

If the gripper 200 was continued to be lower further, the mushroom plunger 184 would be further depressed resulting beam 431 being interrupted and beam 434 being reestablished thru the circumferential notch 434 in the mushroom plunger 184 stem. This is an indication of over travel in height as can be seen in FIG. 39 and FIG. 40.

Figure 41:
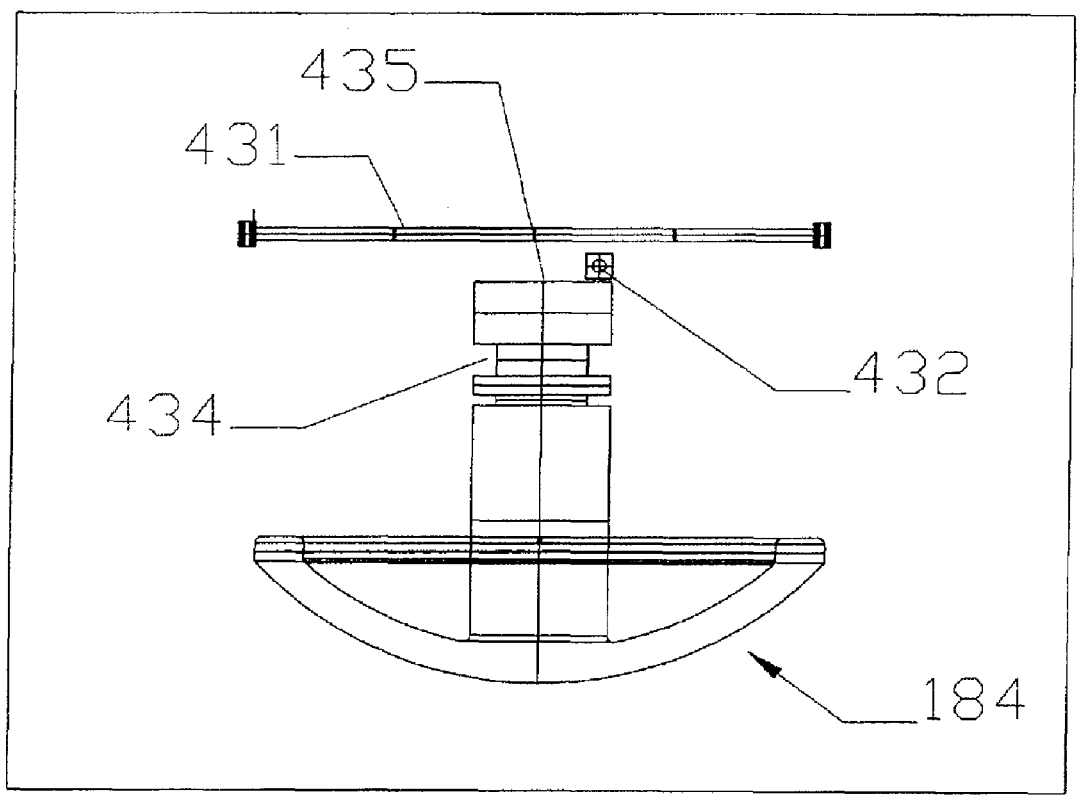
FIG. 41 is a cross sectional front view of the gripper's mushroom sensor in the full down position.
Figure 42:
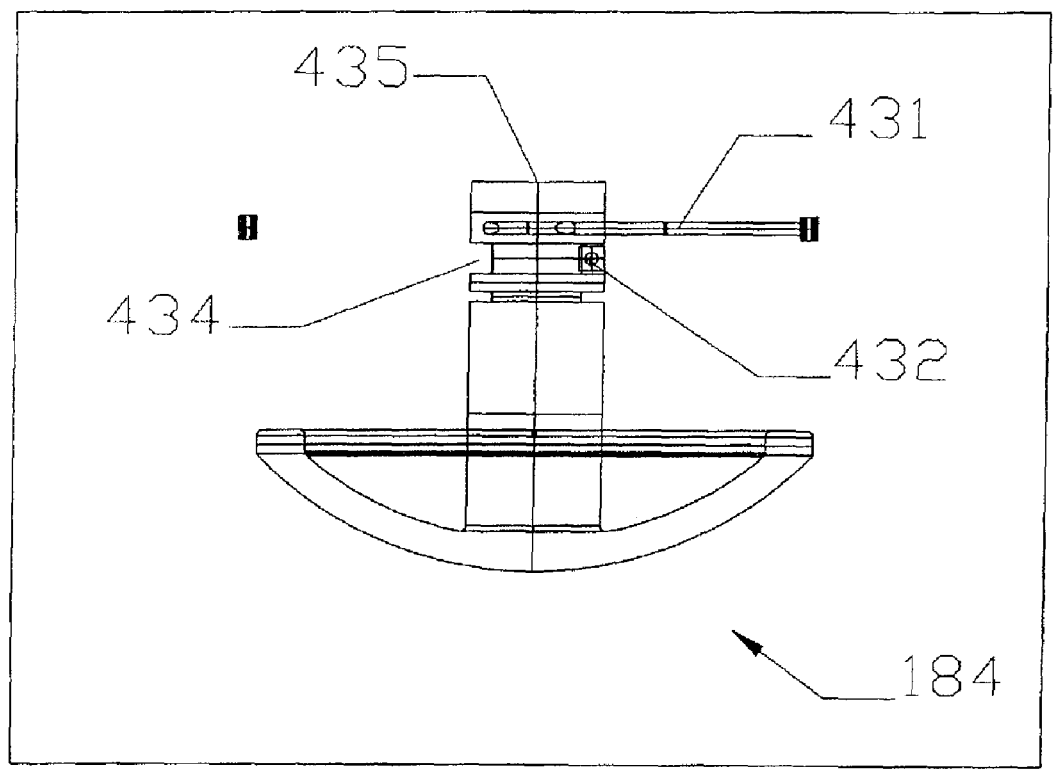
FIG. 42 is a cross sectional front view of the gripper's mushroom sensor in a grip position.
Figure 43:
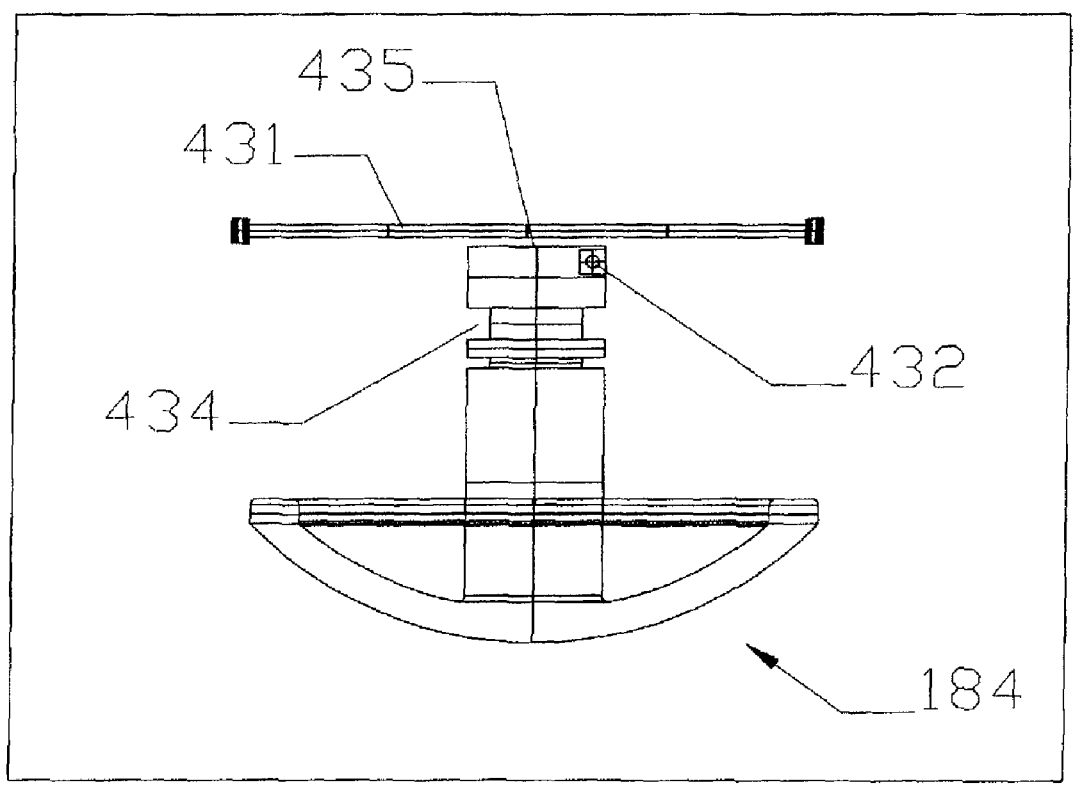
FIG. 43 is a cross sectional front view of the gripper's mushroom sensor in a carry position.
Figure 44:
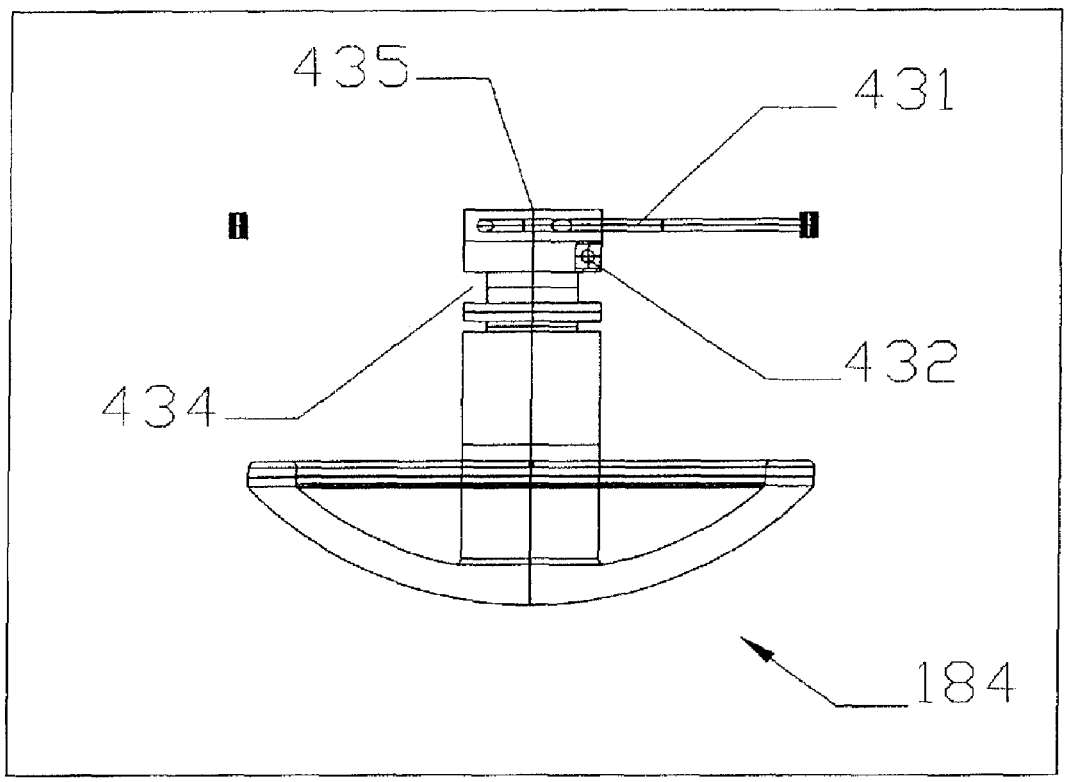
FIG. 44 is a cross sectional front view of the gripper's mushroom sensor in a high down position.

In a simplified cross-sectional view, FIG. 41 shows the beam 431 and 432 with the mushroom in the full down position where no work piece container has been detected. In this position both beams 431 and 432 are established. The position of the mushroom in the close position is shown in FIG. 42. In this position beam 431 is interrupted and beam 432 is established. The carry or lift work piece container position of the mushroom is shown in FIG. 43. In this position the beam 431 is established, while beam 432 is interrupted. In the final position where the gripper has lowered too far onto the robotic handling flange, the mushroom stem is raised too high as shown in FIG. 44. In this position both beams 431 and 432 are interrupted. This mechanism is used to detect and prevent hoist belts from going slack.

Figure 45:
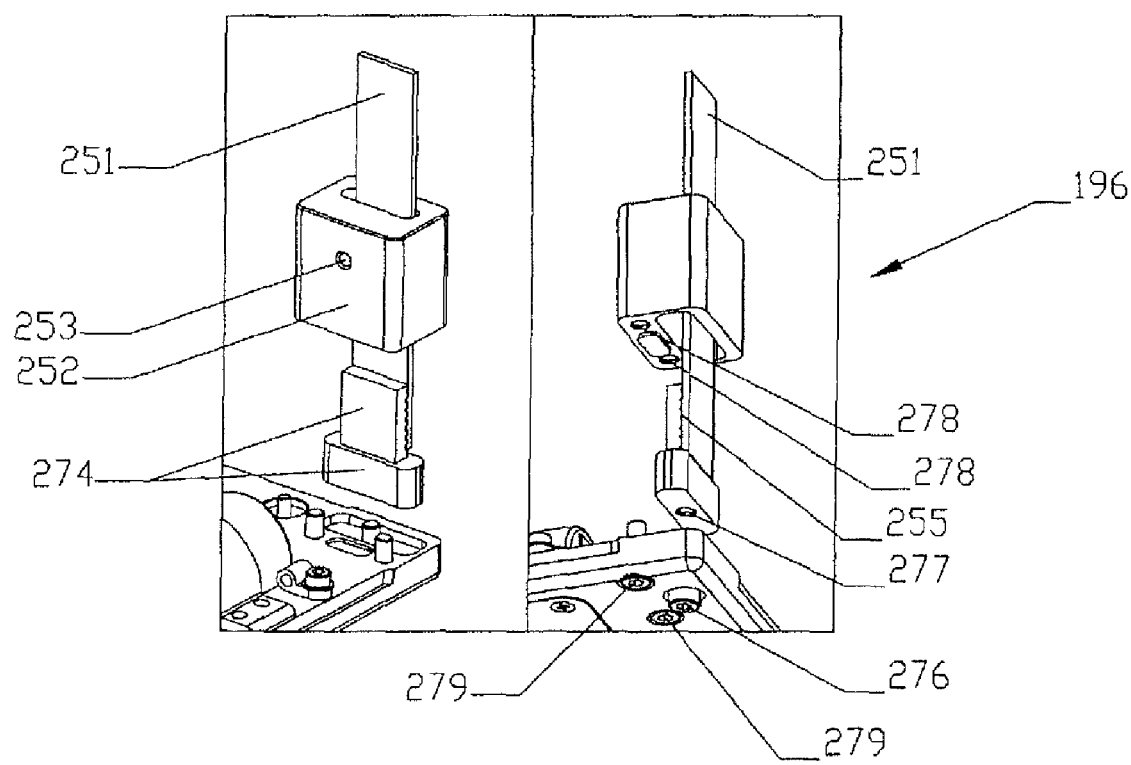
FIG. 45 is a perspective view of the gripper's hoist belt clamp.

The gripper is attached to a set of four hoist belts 251 via a hoist belt clamp 196. The clamp consists of a clamp block housing 252, a belt tooth engagement and adjustment plate 274 as shown in FIG. 45. The adjustment plate 274 has teeth which engage the belt and make the plate and belt captive in the block 252. This prevents the belt from being able to be pulled out of the clamp from the top side. Should a lock screw 253 or belt adjustment screw 276 come loose or fall out, the belt remains captive in the belt clamp block. To level the gripper assembly, the locking screws 253 are loosened, the adjustment screws on each of the four belts are adjusted to level and evenly tension the hoist belts 251. When leveled and tensioned, the locking screws 253 are tightened.

Figure 46:
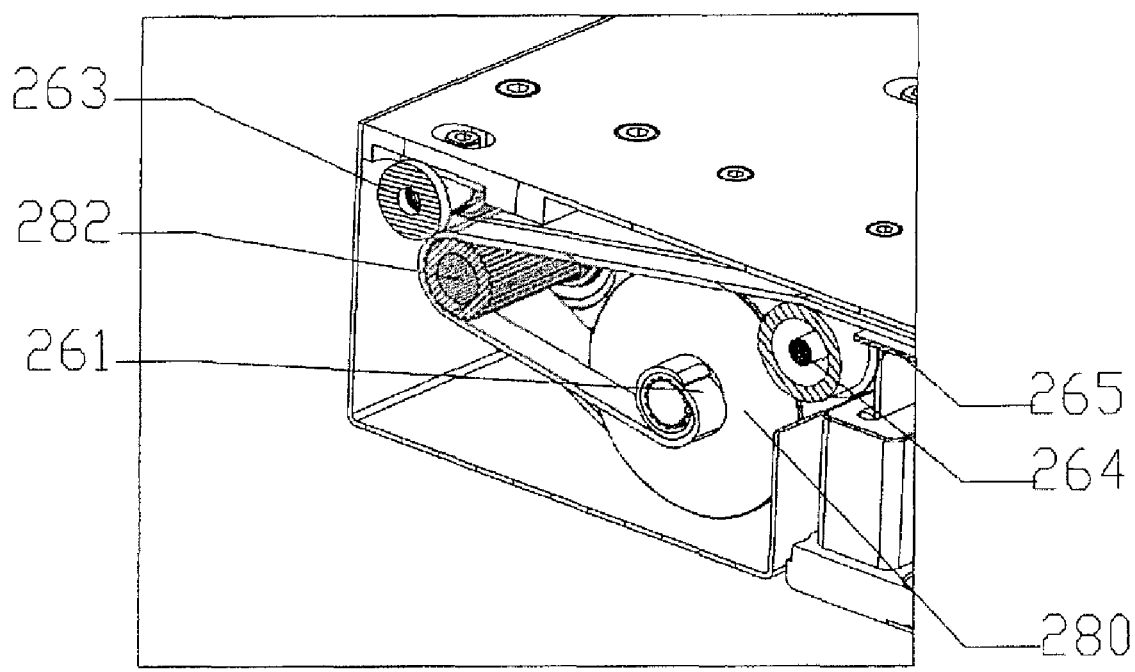
FIG. 46 is a perspective view of the transport devices hoist belt take-up and drive mechanism.

The hoist belt 251 is attached at the top end of the belt to the transporter on the belt take-up spool 280 in FIG. 46. The belt travels up from the gripper over a belt guide idler pulley 264 between a drive sprocket 282 and pressure roller 263 onto the take-up spool 261. The end of the belt is captive in a sprocket like assembly at the center of the take-up spool preventing it from being released should an attempt be made to drive all of the slack belt off of the spool 280.

Figure 47:
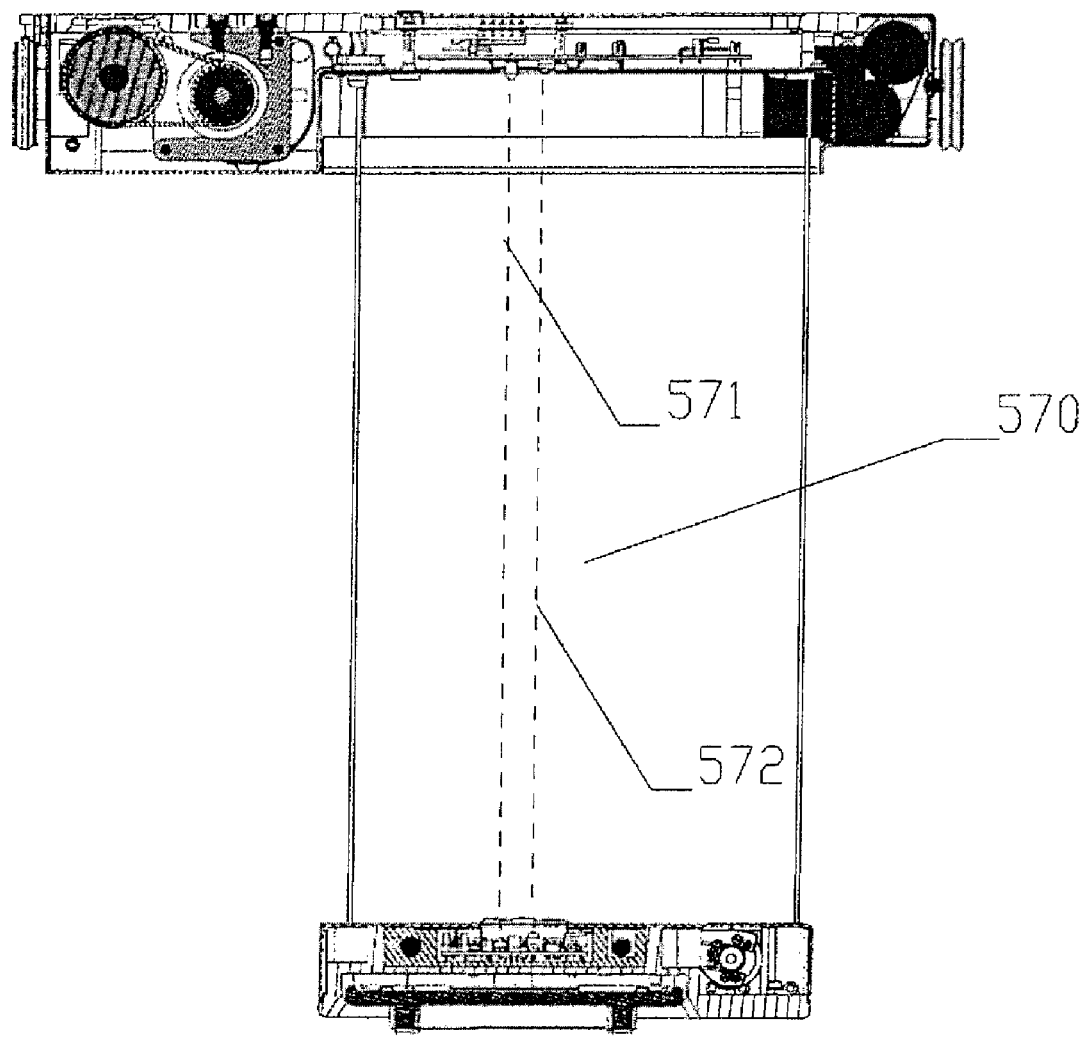
FIG. 47 is a perspective view of the buffer and transporter showing the IRDA optical communication between the two.

The gripper communicates to the transporter via an optical communication mechanism. The optical path from gripper to transporter 571 and the optical path from transporter to gripper 572 allow simultaneous bidirectional communication. This provides real time information from the tilt sensors in the gripper to the transporter and real time communication from the transporter to the gripper as shown in FIG. 47.

Figure 48:
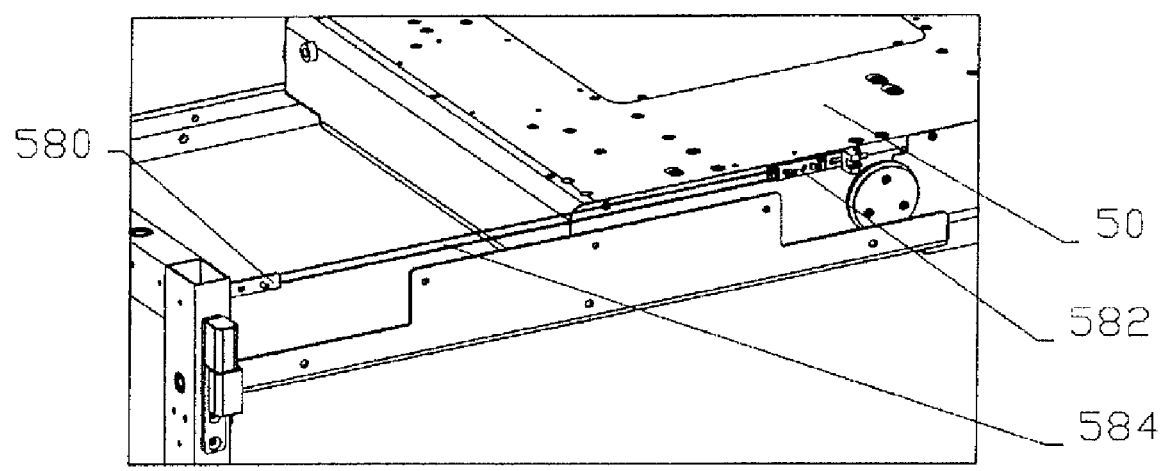
FIG. 48 is a perspective view of a transport device that is configured to communicate wirelessly to a buffer via an IRDA (InfraRed Data Association) transceiver.

Transporter 50 communicates wirelessly to the buffer via an IRDA (InfraRed Data Association) transceiver 582 as shown in FIG. 48. It communicates to the buffer via an IRDA transceiver 580 mounted in the buffer. There is one transceiver 580 mounted on each level of the buffer to provide communication within the buffer. The level of the transponder in the buffer is used to identify the presence or absence of the transporter on that level.

Embodiments can be implemented in digital electronic circuitry, or in computer hardware, firmware, software, or in combinations thereof. Apparatus of the invention can be implemented in a computer program product tangibly embodied or stored in a machine-readable storage device for execution by a programmable processor; and method actions can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language.

Processors suitable for the execution of a computer program include, by way of example, both general and special purpose microprocessors, and any one or more processors of any kind of digital computer. Generally, a processor will receive instructions and data from a read-only memory or a random-access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Computer readable media for embodying computer program instructions and data include all forms of non-volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in special purpose logic circuitry. Any of the foregoing can be supplemented by, or incorporated in, ASICs (application-specific integrated circuits).

To provide for interaction with a user, embodiments can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments can be implemented in a computing system that includes a back end component, e.g., as a data server, or that includes a middleware component, e.g., an application server, or that includes a front end component, e.g., a client computer having a graphical user interface or a Web browser through which a user can interact with an implementation of embodiments, or any combination of such back end, middleware, or front end components. The components of the system can be interconnected by any form or medium of digital data communication, e.g., a communication network. Examples of communication networks include a local area network (LAN) and a wide area network (WAN), e.g., the Internet.

Other embodiments are within the scope and spirit of the description and the claims. For example, due to the nature of software, functions described above can be implemented using software, hardware or firmware or combinations thereof. Features implementing functions may also be physically located at various positions, including being distributed such that portions of functions are implemented at different physical locations. It will be understood that various modifications may be made without departing from the spirit and scope of the application.

What is claimed is:

1. A transport mechanism configured to transport a work piece carrier within a buffer in a fabrication facility, comprising:
- a transporter configured to travel on two rails, wherein the transporter comprises (i) a hoist mechanism configured to lift and to lower the work piece carrier, and (ii) a gripper mechanism configured to capture and to release the work piece carrier;
- a work piece container configured to store one or more work pieces;
- an enclosed frame comprising:
  - one or more storage shelves configured to hold the work piece container and configured for work piece container exchange with an overhead transport vehicle;
  - one or more frame rails mounted (i) above at least one of the one or more storage shelves, and (ii) at a base above a load port on which the transporter is configured to travel; and
  - an elevator configured to move the transporter between a first level and a second level of the buffer;
  - a carriage with one or more carriage rails configured to support the transporter;
  - an alignment device configured to align the one or more carriage rails with at least one of the one or more frame rails;
- a frame support configured to elevate the enclosed frame above one or more load ports of a process tool in the fabrication facility; and
- a control mechanism configured to:
  - direct the transporter to move between one of the one or more storage shelves and a load port location;
  - direct the elevator to move between the first level and the second level of the buffer;
  - synchronize movement of two or more of the elevator, the transporter, and the work piece container; and
  - exchange commands with a work piece container movement system that is configured to manage movement of the work piece container within the fabrication facility.

2. The transport mechanism of claim 1, wherein the control mechanism is further configured to instruct:
- the transporter to travel to a starting location in the fabrication facility;
- the hoist mechanism to lower the gripper mechanism to the work piece carrier;
- the gripper mechanism to capture the work piece carrier;
- the hoist mechanism to raise the gripper mechanism with a captured work piece carrier to a docked position in the fabrication facility;
- the transporter to travel to a destination location in the fabrication facility;
- the hoist mechanism to lower the gripper mechanism with the captured work piece carrier to the destination location;
- the gripper mechanism to release the captured work piece carrier; and
- the hoisting mechanism to retract the gripper mechanism.

3. The transport mechanism of claim 1, wherein the fabrication facility comprises a semiconductor fabrication facility.

4. The transport mechanism of claim 1, wherein the fabrication facility comprises a flat panel fabrication facility.

5. The transport mechanism of claim 1, wherein the transporter is configured to operate on internal power.

6. The transport mechanism of claim 1, wherein the gripper mechanism is configured to operate on internal power.

7. The transport mechanism of claim 6, wherein the internal power comprises battery storage power.

8. The transport mechanism of claim 1, wherein the transporter is configured to receive external power from a resistively coupled electrical connection.

* * * * *